(12) United States Patent
Nagasaka et al.

(10) Patent No.: US 8,089,608 B2
(45) Date of Patent: Jan. 3, 2012

(54) EXPOSURE APPARATUS, EXPOSURE METHOD, AND DEVICE MANUFACTURING METHOD

(75) Inventors: Hiroyuki Nagasaka, Kumagaya (JP); Kenichi Shiraishi, Saitama (JP); Tomoharu Fujiwara, Ageo (JP); Soichi Owa, Kumagaya (JP); Akihiro Miwa, Fukaya (JP)

(73) Assignee: Nikon Corporation, Tokyo (JP)

( * ) Notice: Subject to any disclaimer, the term of this patent is extended or adjusted under 35 U.S.C. 154(b) by 599 days.

(21) Appl. No.: 11/887,584

(22) PCT Filed: Apr. 17, 2006

(86) PCT No.: PCT/JP2006/308040
§ 371 (c)(1),
(2), (4) Date: Oct. 1, 2007

(87) PCT Pub. No.: WO2006/112436
PCT Pub. Date: Oct. 26, 2006

(65) Prior Publication Data
US 2009/0115977 A1 May 7, 2009

(30) Foreign Application Priority Data

Apr. 18, 2005 (JP) ................................. 2005-120185

(51) Int. Cl.
*G03B 27/32* (2006.01)
*G03B 27/42* (2006.01)
*G03B 27/52* (2006.01)
(52) U.S. Cl. .............................. 355/30; 355/53; 355/77
(58) Field of Classification Search .................. 355/30, 355/53, 77; 250/492.2
See application file for complete search history.

(56) References Cited

U.S. PATENT DOCUMENTS

| | | | |
|---|---|---|---|
| 4,346,164 | A | 8/1982 | Tabarelli et al. |
| 4,465,368 | A | 8/1984 | Matsuura et al. |
| 4,480,910 | A | 11/1984 | Takanashi et al. |
| 4,509,852 | A | 4/1985 | Tabarelli et al. |
| 4,780,617 | A | 10/1988 | Umatate et al. |
| 4,780,747 | A | 10/1988 | Suzuki et al. |
| RE32,795 | E | 12/1988 | Matsuura et al. |
| 5,063,582 | A | 11/1991 | Mori et al. |
| 5,243,195 | A | 9/1993 | Nishi |
| 5,493,403 | A | 2/1996 | Nishi |
| 5,528,118 | A | 6/1996 | Lee |
| 5,610,683 | A | 3/1997 | Takahashi |
| 5,623,853 | A | 4/1997 | Novak et al. |

(Continued)

FOREIGN PATENT DOCUMENTS
DE 221 563 A1 4/1985
(Continued)

OTHER PUBLICATIONS

U.S. Appl. No. 10/588,297, filed Aug. 2, 2006.
(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

An exposure apparatus includes an immersion space forming member (70) which fills an optical path space (K1) for exposure light (EL) with a first liquid (LQ) to form an immersion space, and a temperature regulating mechanism (60) which suppresses a change in the temperature of the immersion space forming member (70) accompanying deactivation of formation of the immersion space.

31 Claims, 11 Drawing Sheets

U.S. PATENT DOCUMENTS

| | | | |
|---|---|---|---|
| 5,715,039 | A | 2/1998 | Fukuda et al. |
| 5,738,165 | A | 4/1998 | Imai |
| 5,825,043 | A | 10/1998 | Suwa |
| 5,850,280 | A | 12/1998 | Ohtomo et al. |
| 5,864,386 | A | 1/1999 | Nei |
| 5,874,820 | A | 2/1999 | Lee |
| 5,969,441 | A | 10/1999 | Loopstra et al. |
| 6,020,964 | A | 2/2000 | Loopstra et al. |
| RE36,730 | E | 6/2000 | Nishi |
| 6,208,407 | B1 | 3/2001 | Loopstra |
| 6,228,544 | B1 | 5/2001 | Ota |
| 6,341,007 | B1 | 1/2002 | Nishi et al. |
| 6,400,441 | B1 | 6/2002 | Nishi et al. |
| 6,590,634 | B1 | 7/2003 | Nishi et al. |
| 6,611,316 | B2 | 8/2003 | Sewell |
| 6,650,399 | B2 | 11/2003 | Baselmans et al. |
| 6,674,510 | B1 | 1/2004 | Jasper et al. |
| 6,721,034 | B1 | 4/2004 | Horikawa |
| 6,721,039 | B2 | 4/2004 | Ozawa |
| 6,778,257 | B2 | 8/2004 | Bleeker et al. |
| 6,819,414 | B1 | 11/2004 | Takeuchi |
| 6,897,963 | B1 | 5/2005 | Taniguchi et al. |
| 2002/0041377 | A1 | 4/2002 | Hagiwara et al. |
| 2002/0061469 | A1 | 5/2002 | Tanaka |
| 2002/0063856 | A1 | 5/2002 | Inoue |
| 2004/0165159 | A1 | 8/2004 | Lof et al. |
| 2004/0189964 | A1 | 9/2004 | Nijmeijer et al. |
| 2004/0207824 | A1 | 10/2004 | Lof et al. |
| 2004/0263809 | A1 | 12/2004 | Nakano |
| 2005/0046813 | A1 | 3/2005 | Streefkerk et al. |
| 2005/0088634 | A1 | 4/2005 | Kosugi et al. |
| 2005/0146694 | A1 | 7/2005 | Tokita |
| 2005/0146695 | A1 | 7/2005 | Kawakami |
| 2005/0264780 | A1 | 12/2005 | Graeupner |
| 2006/0007415 | A1 | 1/2006 | Kosugi et al. |
| 2006/0033892 | A1 | 2/2006 | Cadee et al. |
| 2006/0038968 | A1* | 2/2006 | Kemper et al. ............ 355/18 |
| 2006/0061747 | A1 | 3/2006 | Ishii |
| 2006/0152698 | A1 | 7/2006 | Ishii |
| 2006/0187432 | A1 | 8/2006 | Yasuda et al. |
| 2006/0187433 | A1 | 8/2006 | Nagahashi |
| 2007/0132976 | A1* | 6/2007 | Nagasaka .................. 355/57 |
| 2007/0291239 | A1* | 12/2007 | Shiraishi ................... 355/30 |
| 2008/0018867 | A1* | 1/2008 | Fujiwara et al. ........... 355/30 |
| 2008/0068567 | A1 | 3/2008 | Nagasaka et al. |
| 2008/0106707 | A1 | 5/2008 | Kobayashi et al. |
| 2008/0106718 | A1 | 5/2008 | Okada et al. |
| 2008/0266533 | A1 | 10/2008 | Nagasaka et al. |

FOREIGN PATENT DOCUMENTS

| | | |
|---|---|---|
| DE | 224 448 A1 | 7/1985 |
| EP | 0 834 773 A2 | 4/1998 |
| EP | 1 041 357 A1 | 10/2000 |
| EP | 1 420 298 A1 | 5/2004 |
| EP | 1 498 781 A2 | 1/2005 |
| EP | 1 624 481 A1 | 2/2006 |
| EP | 1 628 161 A2 | 2/2006 |
| EP | 1 672 680 A1 | 6/2006 |
| EP | 1 677 341 A1 | 7/2006 |
| EP | 1 843 384 A1 | 10/2007 |
| JP | A 57-117238 | 7/1982 |
| JP | A-57-117238 | 7/1982 |
| JP | A 58-202448 | 11/1983 |
| JP | A 59-019912 | 2/1984 |
| JP | A-61-44429 | 3/1986 |
| JP | A 62-065326 | 3/1987 |
| JP | A 62-183522 | 8/1987 |
| JP | A-62-183522 | 8/1987 |
| JP | A 63-157419 | 6/1988 |
| JP | A-4-065603 | 3/1992 |
| JP | A 04-305915 | 10/1992 |
| JP | A 04-305917 | 10/1992 |
| JP | A 05-021314 | 1/1993 |
| JP | A-5-21314 | 1/1993 |
| JP | A 05-062877 | 3/1993 |
| JP | A-6-053120 | 2/1994 |
| JP | A 06-124873 | 5/1994 |
| JP | A-6-188169 | 7/1994 |
| JP | A-7-176468 | 7/1995 |
| JP | A 07-220990 | 8/1995 |
| JP | A-8-37149 | 2/1996 |
| JP | A-8-130179 | 5/1996 |
| JP | A 08-130179 | 5/1996 |
| JP | A-8-166475 | 6/1996 |
| JP | A 08-316125 | 11/1996 |
| JP | A-8-316125 | 11/1996 |
| JP | A-8-330224 | 12/1996 |
| JP | A-09-232213 | 9/1997 |
| JP | A-10-154659 | 6/1998 |
| JP | A 10-163099 | 6/1998 |
| JP | A-10-163099 | 6/1998 |
| JP | A 10-214783 | 8/1998 |
| JP | A 10-303114 | 11/1998 |
| JP | A 10-340846 | 12/1998 |
| JP | A 11-016816 | 1/1999 |
| JP | A 11-135400 | 5/1999 |
| JP | A 11-176727 | 7/1999 |
| JP | A 2000-058436 | 2/2000 |
| JP | T-2000-505958 | 5/2000 |
| JP | A-2000-164504 | 6/2000 |
| JP | A 2000-164504 | 6/2000 |
| JP | A 2000-205958 | 7/2000 |
| JP | A 2001-510577 | 7/2001 |
| JP | T-2001-510577 | 7/2001 |
| JP | A 2001-267239 | 9/2001 |
| JP | A 2002-005586 | 1/2002 |
| JP | A 2002-014005 | 1/2002 |
| JP | A 2002-071514 | 3/2002 |
| JP | A 2002-198303 | 7/2002 |
| JP | A-2002-231622 | 8/2002 |
| JP | A 2004-519850 | 7/2004 |
| JP | A-2005-051231 | 2/2005 |
| JP | A 2006-024915 | 1/2006 |
| JP | A-2006-24915 | 1/2006 |
| JP | A-2006-165500 | 6/2006 |
| JP | A 2006-165500 | 6/2006 |
| JP | A-10-154659 | 6/2008 |
| WO | WO 99/60361 A1 | 1/1999 |
| WO | WO 99/23692 | 5/1999 |
| WO | WO 99/28790 A1 | 6/1999 |
| WO | WO 99/49504 A1 | 9/1999 |
| WO | WO 01/35168 A1 | 5/2001 |
| WO | WO 03/079418 | 9/2003 |
| WO | WO 03/079418 A1 | 9/2003 |
| WO | WO 2004/019128 A2 | 3/2004 |
| WO | WO 2004/055803 A1 | 7/2004 |
| WO | WO 2004/057590 A1 | 7/2004 |
| WO | WO 2005/029559 A1 | 3/2005 |
| WO | WO 2005/038888 | 4/2005 |
| WO | WO 2005/038888 A1 | 4/2005 |
| WO | WO 2005/071491 A2 | 8/2005 |
| WO | WO 2006/059636 | 6/2006 |
| WO | WO 2006/059636 A1 | 6/2006 |

OTHER PUBLICATIONS

International Search Report issued in Application No. PCT/JP2006/308040; mailed on Jul. 18, 2006.
Oct. 21, 2010 Supplementary European Search Report issued in European Patent Application No. 06731969.9.
Jul. 18, 2006 Written Opinion of the International Searching Authority issued in International Patent Application No. PCT/JP2006/308040 (with translation).
Feb. 4, 2010 Office Action issued in U.S. Appl. No. 10/588,297.
Oct. 26, 2010 Office Action issued in U.S. Appl. No. 10/588,297.
May 17, 2005 International Search Report issued in International Patent Application No. PCT/JP2005/001990 (with translation).
May 17, 2005 Written Opinion of the International Searching Authority issued in International Patent Application No. PCT/JP2005/001990 (with translation).
Oct. 9, 2008 Supplemental European Search Report issued in European Patent Application No. 05710042.2.
Jun. 30, 2011 Office Action issued in European Patent Application No. 06 731 969.9.

* cited by examiner

1

EXPOSURE APPARATUS, EXPOSURE METHOD, AND DEVICE MANUFACTURING METHOD

TECHNICAL FIELD

The present invention relates to an exposure apparatus, an exposure method, and a device manufacturing method which expose a substrate via a liquid.

Priority is claimed on Japanese Patent Application No. 2005-120185, filed Apr. 18, 2005, the content of which is incorporated herein by reference.

BACKGROUND ART

In a photolithography process, which is one of the manufacturing steps of micro devices (electronic devices, etc.), such as semiconductor devices and liquid crystal display devices, an exposure apparatus is used which projects and exposes a pattern formed on a mask onto a photosensitive substrate. This exposure apparatus has a mask stage capable of holding and moving a mask, and a substrate stage capable of holding and moving a substrate, and projects and exposes a pattern of a mask onto a substrate via a projection optical system while sequentially moving the mask stage and the substrate stage. In the manufacture of a micro device, in order to increase the density of the device, it is necessary to make the pattern formed on the substrate fine. In order to address this necessity, even higher resolution of the exposure apparatus is desired. As one means for realizing this higher resolution, there is proposed an immersion exposure apparatus as disclosed in the following Patent Document 1, in which liquid is filled in an optical path space for the exposure light, and exposure light is shone onto the substrate via the liquid, to thereby expose the substrate.

[Patent Document 1] PCT International Publication No. WO 99/49504

DISCLOSURE OF INVENTION

Problems to be Solved by the Invention

In the immersion exposure apparatus, if the temperature of a member, for example, a nozzle member, which fills the optical path space with the liquid to form an immersion space changes, there is a possibility that the temperature of the liquid supplied to the optical path space may change, and thus the optical path space cannot be filled with a desired temperature of liquid. Furthermore, there is possibility that, with a change in the temperature of the nozzle member, various members arranged in the vicinity of the nozzle member may be deformed thermally, and consequently exposure precision may deteriorate.

A purpose of some aspects of the invention is to provide an exposure apparatus and an exposure method capable of preventing deterioration of performance resulting from a change in the temperature of an immersion space forming member (including a nozzle member, for example), and a device manufacturing method using the exposure apparatus and the exposure method.

Means for Solving the Problem

According to a first aspect of the present invention, there is provided an exposure apparatus which exposes a substrate via a first liquid filled into an optical path space for the exposure light. The exposure apparatus includes an immersion space forming member which fills the optical path space for exposure light with the first liquid to form an immersion space, and a temperature regulating mechanism which suppresses a change in the temperature of the immersion space forming member accompanying deactivation of formation of the immersion space.

According to the first aspect of the present invention, since the temperature regulating mechanism for suppressing a change in the temperature of the immersion space forming member is provided, deterioration of exposure precision resulting from a change in the temperature of the immersion space forming member can be prevented.

According to a second aspect of the present invention, there is provided a device manufacturing method using the exposure apparatus of the above aspect.

According to the second aspect of the present invention, a device can be manufactured using an exposure apparatus whose exposure precision is prevented from deteriorating.

According to a third aspect of the present invention, there is provided an exposure method of exposing a substrate with exposure light via a liquid. The method includes exposing the substrate using an immersion space forming member which fills an optical path space for the exposure light with the liquid to form an immersion space, and suppressing a change in the temperature of the immersion space forming member accompanying deactivation of formation of the immersion space.

According to the third aspect of the present invention, deterioration of the exposure precision can be prevented by suppressing a change in the temperature of the immersion space forming member.

According to a fourth aspect of the present invention, there is a provided a device manufacturing method using the exposure method of the above aspect. According to the fourth aspect of the present invention, a device can be manufactured using an exposure apparatus capable of preventing deterioration of exposure precision.

BEST MODE FOR CARRYING OUT THE INVENTION

Hereunder is a description of embodiments of the present invention with reference to the drawings. However, the present invention is not limited to this description.

First Embodiment

Figure 1:
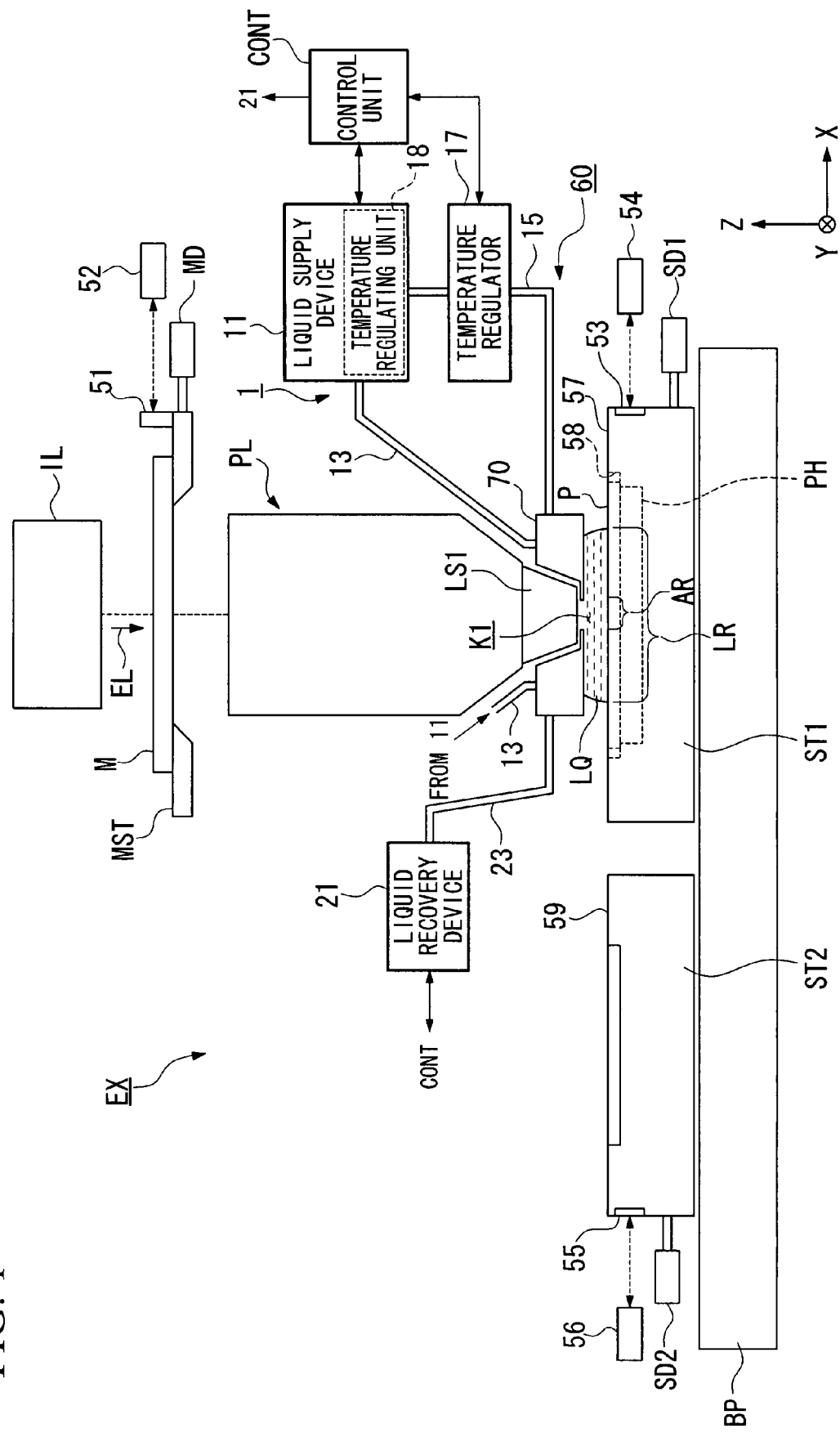
FIG. 1 is a schematic block diagram showing an exposure apparatus according to a first embodiment.

FIG. 1 is a schematic block diagram showing an exposure apparatus EX according to a first embodiment. In FIG. 1, the exposure apparatus EX includes a mask stage MST capable of holding and moving a mask M, a substrate stage ST1 having a substrate holder PH holding a substrate P and capable of moving the substrate P held by the substrate holder PH, a measurement stage ST2 capable of mounting and moving at least some of measuring devices which measure exposure treatment, an illumination optical system IL for illuminating the mask M held by the mask stage MST with exposure light EL, a projection optical system PL for projecting a pattern image of the mask M illuminated with the exposure light EL onto the substrate P held on the substrate stage ST1, and a control unit CONT for controlling operation of the whole exposure apparatus EX. The substrate stage ST1 and the measurement stage ST2 are adapted to be movable independently from each other on a base member BP, at adjacent a image plane side of the projection optical system PL.

The exposure apparatus EX of the present embodiment is an immersion exposure apparatus, to which an immersion method is applied, for substantially shortening the exposure wavelength to improve the resolution, and also substantially expanding the depth of focus. This exposure apparatus includes an immersion mechanism 1 which fills an optical path space K1 of exposure light EL on the image plane side of the projection optical system PL with a liquid LQ to form an immersion space. The immersion mechanism 1 includes a nozzle member 70 which is provided in the vicinity of the image plane of the projection optical system PL, and has a supply port 12 which supplies the liquid LQ to the optical path space K1 and a recovery port 22 which recovers the liquid LQ in the optical path space K1, a liquid supply device 11 which supplies the liquid LQ to adjacent the image plane side of the projection optical system PL via a first supply pipe 13 and the supply port 12 provided in the nozzle member 70, and a liquid recovery device 21 which recovers the liquid LQ at the image plane side of the projection optical system PL via the recovery port 22 provided in the nozzle member 70, and a recovery pipe 23. As will be described in detail below, a passage (supply passage) 14 which connects the supply port 12 with the first supply pipe 13, and a passage (recovery passage) 24 which connects the recovery port 22 with the recovery pipe 23 are provided inside the nozzle member 70. In addition, the supply port, the recovery port, the supply passage, and the recovery passage are not shown in FIG. 1. The nozzle member 70 is formed annularly so as to surround the front optical element LS1 nearest to the image plane of the projection optical system PL, among a plurality of optical elements constituting the projection optical system PL.

Furthermore, the exposure apparatus EX of the present embodiment adopts a local liquid immersion method in which an immersion region LR which is greater than the projection region AR and is smaller than the substrate P is locally formed with a liquid LQ on a portion area including a projection region AR of the projection optical system PL on the substrate P. At least while the pattern image of the mask M is transferred to the substrate P, the exposure apparatus EX fills the liquid LQ into the optical path space K1 for the exposure light EL between the front optical element LS1 nearest to the image plane of the projection optical system PL and the substrate P arranged at adjacent the image plane side of the projection optical system PL by using the immersion mechanism 1, and irradiates the substrate P with the exposure light EL which has passed through the mask M via the projection optical system PL and the liquid LQ filled in the optical path space K1, thereby projecting and exposing the pattern image of the mask M onto the substrate P. The control unit CONT supplies a predetermined amount of the liquid LQ by using the liquid supply device 11 of the immersion mechanism 1 and recovers a predetermined amount of the liquid LQ by using the liquid recovery device 21, thereby filling the optical path space K1 with the liquid LQ, and locally forms the immersion region LR of the liquid LQ on the substrate P.

In addition, the following description will be made for a case where the optical path space K1 is filled with the liquid LQ in a state where the projection optical system PL and the substrate P face each other. However, the same is true in the case where the optical path space K1 is filled with the liquid LQ in a state where an object (for example, at least a portion of the substrate stage ST1 and the measurement stage ST2) other than the substrate P faces the projection optical system PL.

In the present embodiment, a case where a scan type exposure apparatus (so-called scanning stepper) which exposes a pattern formed on the mask M to the substrate P while the mask M and the substrate P are synchronously moved in a scanning direction is used as the exposure apparatus EX will be described as an example. In the following description, a synchronous moving direction (scanning direction) of the mask M and the substrate P within a horizontal plane is defined as the X-axis direction, a direction (a non-scanning direction) orthogonal to the X-axis direction in the horizontal plane is defined as the Y-axis direction, and a direction (in this example, a direction parallel to an optical axis AX of the projection optical system PL) orthogonal to both the X-axis direction and the Y-axis direction is defined as the Z axis direction. Furthermore, directions of rotation (inclination) about the X axis, the Y axis, and the Z axis are defined as the $\theta X$, the $\theta Y$, and the $\theta Z$ directions, respectively. In addition, the term "substrate" includes a substrate which is obtained by coating a film, such as a resist and a protective film, on a semiconductor wafer. The "mask" includes a reticle in which a device pattern to be reduction-projected onto a substrate is formed.

Furthermore, although described in detail below, the exposure apparatus EX is equipped with a temperature regulating mechanism 60 for suppressing a change in the temperature of an immersion space forming member (the nozzle member 70 in the present embodiment) after the liquid LQ in the optical path space K1 has been removed (namely, after formation of the immersion space has been deactivated). The temperature regulating mechanism 60 connects the liquid supply device 11 with the recovery passage 24 provided in the nozzle member 70, and is equipped with a second supply pipe 15 which supplies the liquid LQ delivered from the liquid supply device 11 to the recovery passage 24.

The illumination optical system IL has a light source for exposure, an optical integrator which uniformizes the illuminance of a flux of light emitted from the light source for exposure, a condenser lens which condenses the exposure light EL from the optical integrator, a relay lens system, and a field stop which sets an illuminated region on the mask M of the exposure light EL. A predetermined illuminated region on the mask M is illuminated with the exposure light EL having uniform illuminance distribution by the illumination optical system IL. As the exposure light EL emitted from the illumination optical system IL, for example, emission lines (g-ray, h-ray, i-ray) emitted from a mercury lamp, deep ultraviolet beams (DUV beams) such as KrF excimer laser beams (wavelength: 248 nm), and vacuum ultraviolet light beams (VUV beams) such as ArF excimer laser beams (wavelength: 193 nm) and F2 laser beams (wavelength: 157 nm), may be used. In the present embodiment, the ArF excimer laser beams are used.

In the present embodiment, pure water is used as the liquid LQ. Not only the ArF excimer laser beams but, for example, emission lines (g-ray, h-ray, i-ray) emitted from a mercury lamp and KrF excimer laser beams (wavelength: 248 nm) can be transmitted through the pure water.

The mask stage MST is capable of holding and moving the mask M. The mask stage MST holds the mask M, for example, by vacuum absorption, etc. The mask stage MST is movable two-dimensionally within a plane vertical to the optical axis AX of the projection optical system PL, i.e., within an XY plane, and is rotatable minutely in the θZ direction, in a state where it holds the mask M by driving of a mask stage drive MD including a linear motor controlled by the control unit CONT. A moving mirror 51 is provided on the mask stage MST. Furthermore, a laser interferometer 52 is provided in a position which faces the moving mirror 51. As for the mask M on the mask stage MST, the position in the two-dimensional directions and the rotation angle (in some cases, the rotation angles in the θX and θY directions are also included) in the θZ direction are measured in real time by the laser interferometer 52. The measurement results of the laser interferometer 52 are output to the control unit CONT. The control unit CONT controls the mask stage drive MD and controls the position of the mask M held by the mask stage MST, on the basis of the measurement results of the laser interferometer 52.

In addition, the laser interferometer 52 may be provided such that a portion (for example, optical system) thereof faces the moving mirror 51. The moving mirror 51 may include not only a plane mirror, but also a corner cube (retroreflector). Otherwise, instead of securing the moving mirror 51, for example, a reflecting surface which is formed by mirror-polishing the end surface (side surface) of the mask stage MST may be used. Furthermore, the mask stage MST may be of a construction capable of coarse/fine movement as disclosed for example in Japanese Unexamined Patent Application, First Publication No. H8-130179 (corresponding U.S. Pat. No. 6,721,034).

The projection optical system PL is a system which projects a pattern of the mask M onto the substrate P at a predetermined projection magnification β, and is composed of a plurality of optical elements, and these optical elements are held by a lens barrel PK. In the present embodiment, the projection optical system PL is a reduction system with a projection magnification of for example ¼, ⅕, or ⅛, and forms a reduced image of the mask pattern on the projection region AR conjugate with the aforementioned illuminated region. The projection optical system PL may be a reduction system, an equal system or a magnification system. Furthermore, the projection optical system PL may include any one of a refractive system which does not include a reflection optical element, a reflection system which does not include a refractive optical element, or a cata-dioptric system which includes a reflection optical element and a refractive optical element. The front optical element LS1 nearest to the image plane of the projection optical system PL, among a plurality of optical elements constituting the projection optical system PL, is exposed from the lens barrel PK. Although the front optical element LS1 is a lens element having refractive power, it may be a plane-parallel plate having no refractive power.

The substrate stage ST1 has a substrate holder PH for holding the substrate P, and is capable of moving the substrate P held on the substrate holder PH. The substrate holder PH holds the mask M, for example, by vacuum absorption, etc. A recess 58 is provided on the substrate stage ST1, and the substrate holder PH for holding the substrate P is arranged in the recess 58. Also, a top face 57 of the substrate stage ST1 other than the recess 58 is formed as a flat face such that it has substantially the same height (flush with) as the surface of the substrate P held by the substrate holder PH. This is because a portion of the aforementioned immersion region LR which runs out from the surface of the substrate P is formed on the top face 57 at the time of the exposure operation of the substrate P. Only a portion of the top face 57 of the substrate stage ST1, for example, a predetermined region surrounding the substrate P (including the region where the immersion region LR runs out), may be approximately the same height as the surface of the substrate P. Furthermore, if the optical path space K1 on the image plane side of the projection optical system PL is continuously filled with the liquid LQ (that is, if the immersion region LR can be favorably maintained), then there may be a step between the top face 57 of the substrate stage ST1 and the surface of the substrate P held by the substrate holder PH. Furthermore, the substrate holder PH may be formed integrally with a portion of the substrate stage 1. However, in the present embodiment, the substrate holder PH and the substrate stage 1 are made separate, and the substrate holder PH is secured in the recess 58, for example, by vacuum absorption.

The substrate stage ST1 is movable two-dimensionally within the XY plane on the base member BP, and is rotatable minutely in the θZ direction, in a state where it holds the substrate P with the substrate holder PH by driving of a substrate stage drive MD1 including a linear motor controlled by the control unit CONT. Furthermore, the substrate stage ST1 is also movable in the Z-axis direction, θX direction, and θY direction. Accordingly, the surface of the substrate P held on the substrate stage ST1 is movable in directions of six degrees of freedom, i.e., in the X-axis, Y-axis, Z-axis, θX, θY, and θZ directions. A moving mirror 53 is provided on a side face of the substrate stage ST1. Furthermore, a laser interferometer 54 is provided in a position which faces the moving mirror 53. As for the substrate P on the substrate stage ST1, the position in the two-dimensional directions and the rotation angle are measured in real time by the laser interferometer 54. Furthermore, although not shown, the exposure apparatus EX is equipped with a focus leveling detecting system which detects surface positional information on the surface of the substrate P held on the substrate stage ST1.

The laser interferometer 54 may be provided such that only a portion (for example, optical system) thereof faces the moving mirror 53, and may measure the position in the Z-axis direction, and rotational information in the θX and θY directions, of the substrate stage ST1. Details of an exposure apparatus having a laser interferometer which is capable of measuring the position in the Z axis direction of the substrate stage ST1 are disclosed in, for example, Japanese Unexamined Patent Application, First Publication No. 2001-510577 (corresponding PCT International Publication No. WO 1999/28790). Furthermore, instead of securing the moving mirror 53 to the substrate stage ST1, for example, a reflecting surface which is formed by mirror-polishing a portion (the side face, etc.) of the substrate stage ST1 may be used.

Furthermore, the focus leveling detecting system is a system which measures the positional information in the Z-axis direction of the substrate P at a plurality of measuring points, respectively, thereby detecting the inclination information (rotation angle) in the θX and θY directions of the substrate P. At least some of the plurality of measuring points may be set within the immersion region LR (or projection region AR), or all the measuring points may be set outside the immersion region LR. Moreover, for example, when the laser interferometer 54 is capable of measuring the positional information in the Z-axis, θX, and θY directions of the substrate P, then it is possible to measure the positional information in the Z-axis direction during the exposure operation of the substrate P, and hence the focus leveling detection system may not be provided, and position control of the substrate P in the Z-axis, θX, and θY directions may be performed using the measurement results of the laser interferometer 54, at least during the exposure operation.

The measurement results of the laser interferometer 54 are output to the control unit CONT. The detection results of the focus leveling detecting system are also output to the control unit CONT. On the basis of the detection results of the focus leveling detecting system, the control unit CONT drives the substrate stage drive SD1, and controls the focusing position (Z position) and inclination angle (θX, θY) of the substrate P. The surface of the substrate P is matched with an image plane formed via the projection optical system PL and liquid LQ, and position control in the X-axis direction, Y-axis direction, and θZ direction of the substrate P is performed on the basis of the measurement results of the laser interferometer 54.

The measurement stage ST2 is mounted with various measuring devices (including a measuring member) which measure exposure treatment, and is provided so as to be movable on the base member BP on the side of the image plane of the projection optical system PL. The measurement stage ST2 is driven by a measurement stage drive SD2. The measurement stage drive SD2 is controlled by the control unit CONT. Also, the control unit CONT is capable of independently moving the substrate stage ST1 and the measurement stage ST2 on the base member BP, using the stage drives SD1 and SD2, respectively. The measurement stage drive SD2 has a configuration equivalent to the substrate stage drive SD1, and the measurement stage ST2 is movable in the X-axis, Y-axis, and Z-axis directions and in the θX, θY, and θZ directions by the measurement stage drive SD2, similarly to the substrate stage ST1. Furthermore, a moving mirror 55 is provided on the side face of the measurement stage ST2, and a laser interferometer 56 is provided in the position which faces the moving mirror 55. The position in the two-dimensional directions and rotation angle of the measurement stage ST2 are measured in real time by the laser interferometer 56, and the control unit CONT controls the position of the measurement stage ST2 on the basis of the measurement results of the laser interferometer 56. The laser interferometer 56 may be provided such that only a portion (for example, an optical system) thereof faces the moving mirror 55, and may measure the position in the Z-axis direction, and rotation angle in the θX and θY directions, of the measurement stage ST2. Furthermore, instead of securing the moving mirror 55 to the measurement stage ST2, for example, a reflecting surface which is formed by mirror-polishing a portion (the side face, etc.) of the measurement stage ST2 may be used.

As the measuring device mounted to the measurement stage ST2, a reference mark plate in which a plurality of reference marks are formed as disclosed in, for example, Japanese Unexamined Patent Application, First Publication No. H5-21314 (corresponding to U.S. Pat. No. RE36,730), an unevenness sensor for measuring illuminance unevenness as disclosed in, for example, Japanese Unexamined Patent Application, First Publication No. S57-117238 (corresponding to U.S. Pat. No. RE32,795) and for measuring the amount of fluctuation in the transmittance of the exposure light EL of the projection optical system PL as disclosed in Japanese Unexamined Patent Application, First Publication No. 2001-267239 (corresponding to U.S. Pat. No. 6,721,039), a spatial image measuring sensor as disclosed in Japanese Unexamined Patent Application, First Publication Nos. 2002-14005 and 2002-198303 (corresponding to U.S. Patent Publication No. 2002/0041377A1), and a radiant exposure sensor (illuminance sensor) as disclosed in Japanese Unexamined Patent Application, First Publication No. H11-16816 (corresponding to U.S. Patent Publication No. 2002/0061469A1) can be exemplified. Otherwise, as the measuring device mounted to the measurement stage ST2, a wave aberration measuring device as disclosed in, for example, PCT International Patent Publication No. WO 99/60361 (corresponding to U.S. Pat. No. 6,819,414), Japanese Unexamined Patent Application, First Publication No. 2002-71514, U.S. Pat. No. 6,650,399, etc., and a reflecting unit as disclosed in, for example, Japanese Unexamined Patent Application, First Publication No. S62-183522 (corresponding to U.S. Pat. No. 4,780,747), etc. can be exemplified.

As such, the measurement stage ST2 is a dedicated stage for measuring exposure treatment, and has a configuration which does not hold the substrate P, and the substrate stage ST1 has a configuration which is not mounted with a measuring device which measures exposure treatment. In addition, an exposure apparatus equipped with such a measurement stage is disclosed in detail in, for example, Japanese Unexamined Patent Application, First Publication No. H11-135400 (corresponding PCT International Publication No. WO 1999/23692), Japanese Unexamined Patent Application, First Publication No. 2000-164504 (corresponding U.S. Pat. No. 6,897,963), etc. At least some of the above-mentioned measuring devices may be mounted to the substrate stage ST1.

Furthermore, a top face 59 of the measurement stage ST2, and the top face 57 of the substrate stage ST1 including the surface of the substrate P are provided substantially flush with each other. In the present embodiment, the control unit CONT can control (adjust) the driving of at least one of the stages ST1 and ST2 in the Z-axis direction (and/or θX and θY directions) so that the top face 57 of the substrate stage ST1 and the top face 59 of the measurement stage ST2 may be located in substantially the same position (height) in the Z-axis direction.

Furthermore, in a state where the top face 57 of the substrate stage ST1 and the top face 59 of the measurement stage ST2 are caused to contact each other (or approach each other) while the supply operation and recovery operation of the liquid LQ by the immersion mechanism 1 are performed, the control unit CONT can move the substrate stage ST1 and the measurement stage ST2 together, for example, in the X-axis direction below the projection optical system PL, thereby moving the immersion region LR formed at the image plane side of the projection optical system PL between the top face 57 of the substrate stage ST1 and the top face 59 of the measurement stage ST2. In this case, the top faces 57 and 59 of the substrate stage ST1 and the measurement stage ST2 are set to substantially the same height (Z position), and so driving of the stages is performed concurrently.

Figure 2:
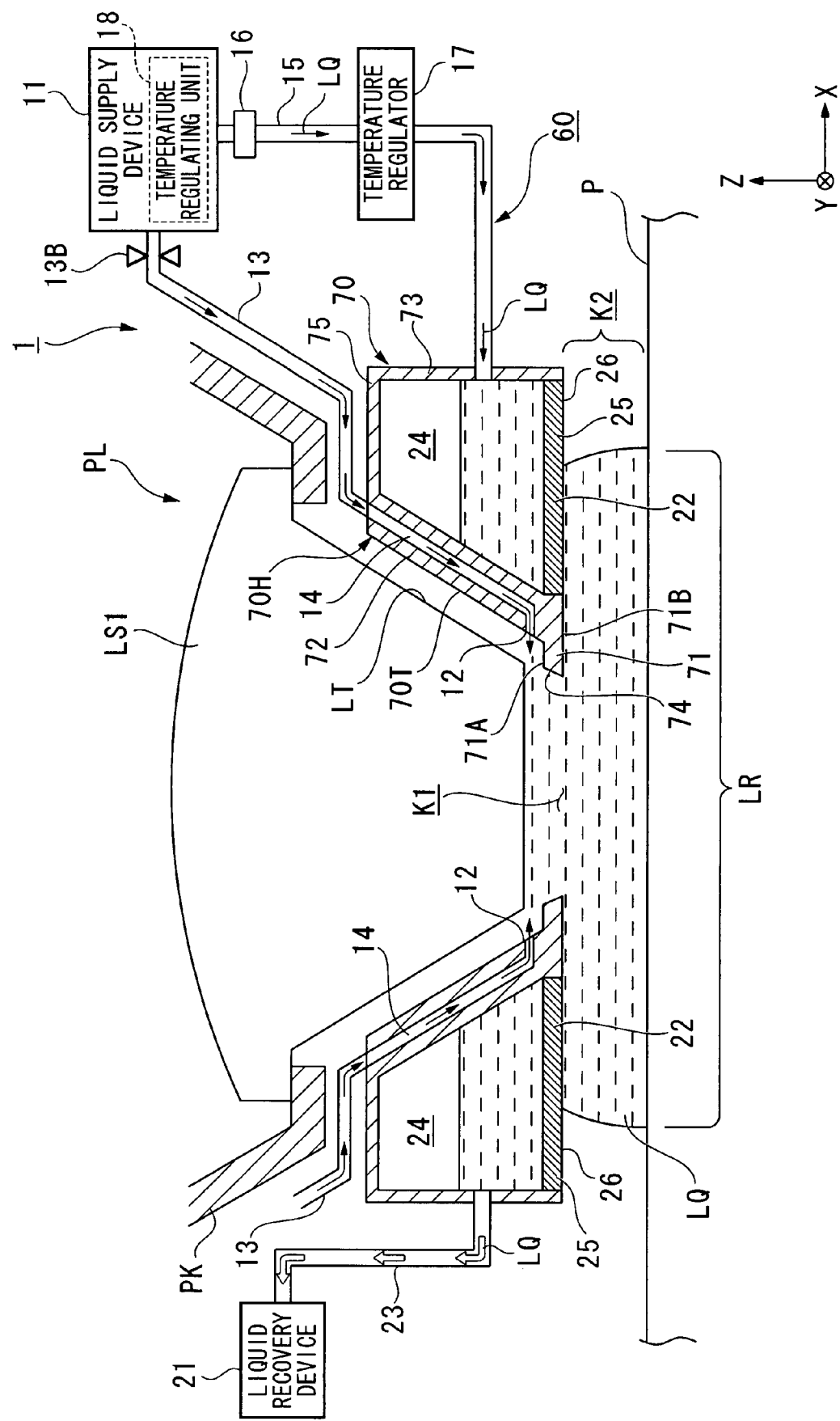
FIG. 2 is a view for explaining an immersion mechanism and a temperature regulating mechanism.

Next, the immersion mechanism 1 will be described referring to FIG. 2. FIG. 2 is a sectional view in the vicinity of the nozzle member 70. The liquid supply device 11 of the immersion mechanism 1 is a device which supplies the liquid LQ for filling the optical path space K1 on the light emission side of the front optical element LS1 with the liquid LQ, and has a tank containing the liquid LQ, a booster pump, a temperature regulating unit which regulates the temperature of the liquid LQ to be supplied, a filter unit which removes foreign matters in the liquid LQ, etc. A temperature regulating unit 18 is shown as an example in the drawing. One end of the first supply pipe 13 is connected to the liquid supply device 11, and the other end of the first supply pipe 13 is connected to the nozzle member 70. The liquid supply operation of the liquid supply device 11 is controlled by the control unit CONT. Not all of the tank, booster pump, temperature regulating unit, filter unit, etc. of the liquid supply device 11 need to be provided in the exposure apparatus EX, and they may be substituted with facilities in a factory in which the exposure apparatus EX is installed.

The liquid recovery device 21 of the immersion mechanism 1 is a device which recovers the liquid LQ filled in the optical path space K1 on the light emission side of the front optical element LS1, and has a vacuum system, such as a vacuum pump, a gas-liquid separator which separates the liquid LQ to be recovered and gas, and a tank which contains the recovered liquid LQ. One end of the recovery pipe 23 is connected to the liquid recovery device 21, and the other end of the recovery pipe 23 is connected to the nozzle member 70. The liquid recovery operation of the liquid recovery device 21 is controlled by the control unit CONT. Not all of the vacuum system, gas-liquid separator, tank, etc. of the liquid recovery device 21 need to be provided in the exposure apparatus EX, and they may be substituted with facilities in a factory in which the exposure apparatus EX is installed.

The nozzle member 70 is an annular member which is provided so as to surround at least one optical element (front optical element LS1 in the present embodiment) which is arranged on the image plane side of the projection optical system PL, and has a hole 70H in the center of which the front optical element LS1 can be disposed. The nozzle member 70 has a bottom plate 71 which faces the surface of the substrate P held on the substrate stage ST1, an inclined plate 72 which faces a side face LT of the front optical element LS1, a side plate 73, and a top plate 75. The inclined plate 72 is formed in the shape of a pot, and the front optical element LS1 is arranged inside the hole 70H formed by the inclined plate 72. The side face LT of the front optical element LS1 and an internal surface 70T of the hole 70H of the nozzle member 70 face each other with a predetermined gap. The bottom plate 71 is arranged between the bottom face of the front optical element LS1, and the substrate P. An opening 74 for allowing the exposure light EL to pass therethrough is provided in the bottom plate 71. A top face 71A of the bottom plate 71 faces the bottom face of the front optical element LS1 with a predetermined gap, and a bottom face 71B of the bottom plate 71 faces the surface of the substrate P with a predetermined gap. The top face 71A of the bottom plate 71 is connected with a bottom end of the internal surface 70T. A bottom face 71B of the bottom plate 71 is a flat face.

The nozzle member 70 is equipped with the supply port 12, which supplies the liquid LQ to the optical path space K1 for the exposure light EL, and the recovery port 22, which recovers the liquid LQ in the optical path space K1 for the exposure light EL. Furthermore, the nozzle member 70 is equipped with the supply passage 14 connected to the supply port 12, and the recovery passage 24 connected to the recovery port 22.

The supply port 12 is a port for supplying the liquid LQ to the optical path space K1, and is provided in the vicinity of the top face 71A of the bottom plate 71 in the internal surface 70T of the nozzle member 70. The supply port 12 is provided outside the optical path space K1. In the present embodiment, a pair of the supply ports 12 is provided on both sides of the optical path space K1, respectively, in the X-axis direction. Alternatively, a pair of the supply ports 12 may be provided on both sides of the optical path space K1, respectively, in the Y-axis direction, and a plurality of the supply ports may be provided so as to surround the optical path space K1.

The supply passage 14 is formed by a through hole in the shape of a slit which penetrates the inclined plate 72 of the nozzle member 70 in a direction of inclination. The supply port 12 and the first supply pipe 13 are connected together via the supply passage 14. The other end of the first supply pipe 13 is connected with a top end of the supply passage 14, and the supply port 12 is connected with a bottom end of the supply passage 14. Accordingly, the liquid supply device 11 and the supply port 12 are connected together via the first supply pipe 13 and the supply passage 14, and the liquid LQ is supplied to the supply port 12 from the liquid supply device 11.

The liquid LQ supplied from the supply port 12 is filled into a predetermined space K2 between the bottom faces of the projection optical system PL and nozzle member 70 and the surface of the substrate P (immersion space), including the optical path space K1. The liquid LQ is held between the projection optical system PL and the nozzle member 70, and the substrate P. The liquid LQ filled into the predetermined space K2 contacts at least a portion of the nozzle member 70.

Furthermore, a valve mechanism 13B which can open and close the passage of the first supply pipe 13 is provided in the middle of the passage of the first supply pipe 13. The operation of the valve mechanism 13B is controlled by the control unit CONT. The control unit CONT can operate the valve mechanism 13B so as to close the passage of the first supply pipe 13, thereby stopping supply of the liquid LQ to the supply port 12 from the liquid supply device 11.

The recovery port 22 is a port for recovering the liquid LQ in the optical path space K1, and is provided in the bottom face of the nozzle member 70 facing the substrate P. The recovery port 22 is provided annularly so as to surround the optical path space K1 further outside the supply port 12 and the bottom plate 71 with respect to the optical path space K1.

The recovery passage 24 is provided inside the nozzle member 70. A space which is open downward between the inclined plate 72 and the side plate 73 is formed in the nozzle member 70, and the recovery passage 24 is constituted by this space. The recovery port 22 is arranged in a lower end (opening) of the space, and is connected to the recovery passage 24. Also, the other end of the recovery pipe 23 is connected to a portion of the recovery passage 24. Accordingly, the liquid recovery device 21 and the recovery port 22 are connected together via the recovery passage 24 and the recovery pipe 23. The liquid recovery device 21 including a vacuum system can form a negative pressure in the recovery passage 24, thereby recovering the liquid LQ which exists in the predetermined space K2 between the substrate P and the nozzle member 70 and projection optical system PL via the recovery port 22, including the optical path space K1. The liquid LQ filled into the optical path space K1 (predetermined space K2) flows into the recovery passage 24 via the recovery port 22 of the nozzle member 70, and the liquid LQ which has flowed into the recovery passage 24 is recovered by the liquid recovery device 21. As such, the liquid recovery device 21 can form a negative pressure in the recovery passage 24, thereby recovering the liquid LQ in the optical path space K1 (predetermined space K2) via the recovery port 22 and recovering the liquid LQ of the recovery passage 24.

The nozzle member 70 is equipped with a porous member 25, which has a plurality of holes provided so as to cover the recovery port 22. The porous member 25 is formed annularly in plan view. Although the porous member 25 could be a porous body, etc. made from ceramic, it can be constituted by, for example, a mesh member with a plurality of holes. As the material which can form the porous member 25, titanium, stainless steel (for example, SUS316), ceramics, etc. can be exemplified.

In the present embodiment, the porous member 25 is formed from titanium and has lyophilicity (hydrophilic properties) to the liquid LQ. Of course, the porous member 25 may be formed from lyophilic materials other than titanium. Furthermore, the porous member 25 may be formed from stainless steel (for example, SUS316), and may be subjected to lyophilic treatment (surface treatment) so that the surface thereof may be made lyophilic. As an example of the lyophilic treatment, treatment which causes chrome oxide to adhere to the porous member 25 can be exemplified. Specifically, "GOLDEP" treatment or "GOLDEP WHITE" treatment with Kobelco Eco-Solutions Co., Ltd. can be exemplified. Furthermore, elution of impurities from the porous member 25 to the liquid LQ is suppressed by performing such surface treatment.

The porous member 25 has a bottom face 26 which faces the substrate P held on the substrate stage ST1. The bottom face 26 of the porous member 25 is substantially flat. The porous member 25 is provided in the recovery port 22 so that the bottom face 26 thereof may be substantially parallel to the surface (namely, XY plane) of the substrate P held on the substrate stage ST1. Furthermore, the bottom face 26 of the porous member 25 provided in the recovery port 22 and the bottom face 71B of the bottom plate 71 are provided in substantially the same position (height) from the surface of the substrate P.

Figure 3A:
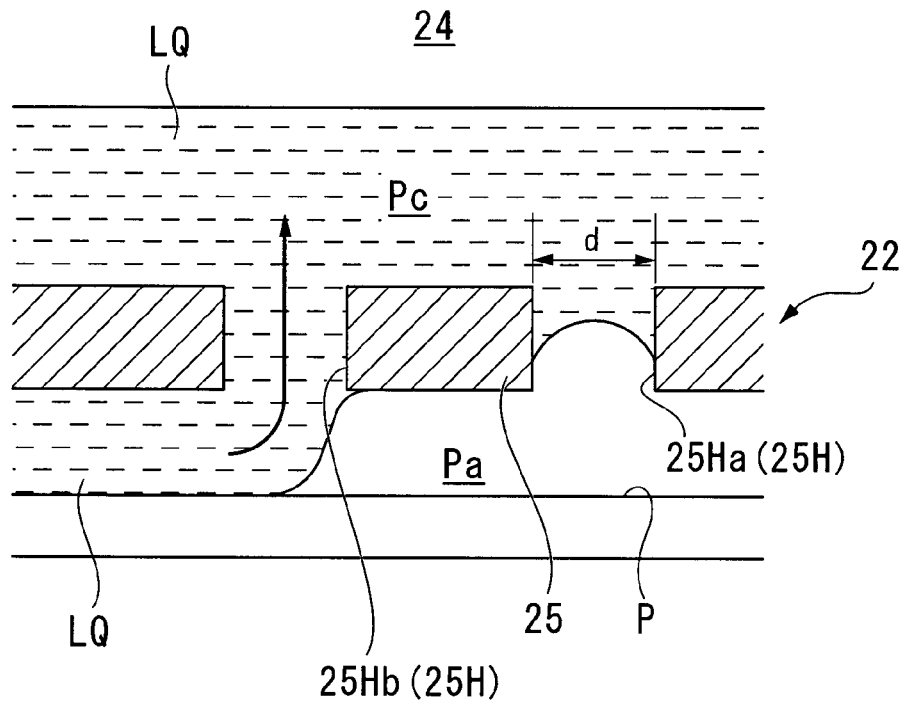
FIG. 3A is a view for explaining the principle of a liquid recovery operation by the immersion mechanism.
Figure 3B:
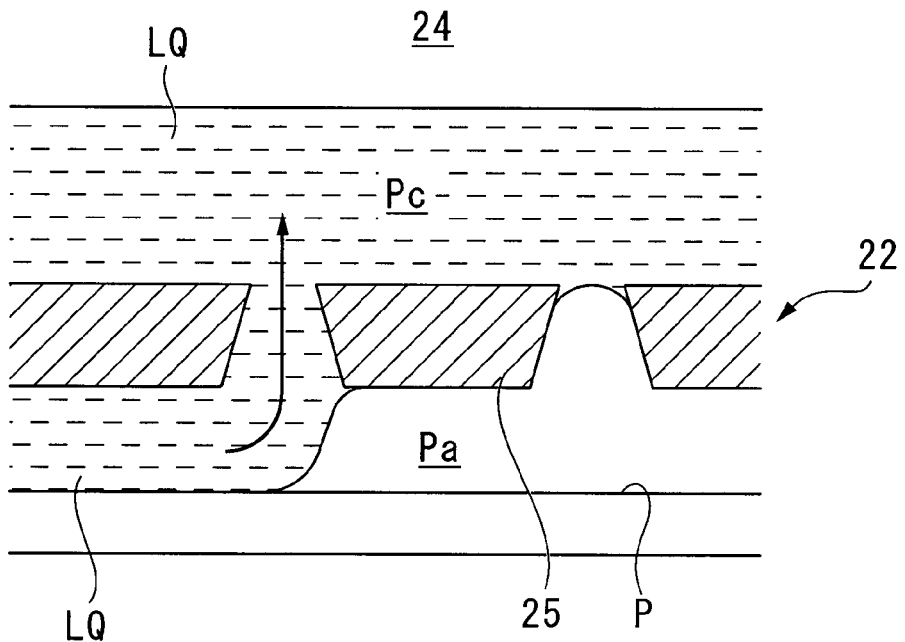
FIG. 3B is a view for explaining the principle of the liquid recovery operation by the immersion mechanism.

Here, the principle of the liquid recovery operation by the immersion mechanism 1 in the present embodiment will be described referring to FIGS. 3A and 3B. FIG. 3A is a partially enlarged sectional view of the porous member 25, and is a schematic diagram for explaining the liquid recovery operation performed via the porous member 25. In the present embodiment, the immersion mechanism 1 is provided so as to recover only the liquid LQ via the recovery port 22. Accordingly, the immersion mechanism 1 can recover the liquid LQ well, without causing gas to substantially flow into the recovery passage 24 via the recovery port 22.

Referring to FIG. 3A, the porous member 25 is provided in the recovery port 22. Furthermore, the substrate P is arranged below the porous member 25. Furthermore, in FIGS. 3A and 3B, a gas space and a liquid space are formed between the porous member 25 and the substrate P. More specifically, a gas space is formed between a first hole 25Ha of the porous member 25 and the substrate P, and a liquid space is formed between a second hole 25Hb of the porous member 25 and the substrate P. Furthermore, the recovery passage (passage space) 24 is formed above in the porous member 25.

When the pressure (pressure on the bottom face of the porous member 25H) between the first hole 25Ha of the porous member 25 and the substrate P is defined as "Pa", the pressure (pressure on the top face the porous member 25) of the passage space 24 above the porous member 25 is defined as "Pc", the hole diameter (diameter) of each of the holes 25Ha and 25Hb is defined as "d", the angle of contact of the porous member 25 (internal surface of the hole 25H) with respect to the liquid LQ is defined as "θ", and the surface tension of the liquid LQ is defined as "γ", the immersion mechanism 1 of the present embodiment is set to satisfy the following condition:

$$(4 \times \gamma \times \cos\theta)/d \geq (Pa - Pc) \quad (1)$$

In the above Expression (1), in order to simplify the description, the hydrostatic pressure of the liquid LQ above the porous member 25 is not taken into consideration.

In this case, it is necessary that the contact angle θ of the porous member 25 (internal surface of the hole 25H) with respect to the liquid LQ satisfy the following condition:

$$\theta \leq 90 \quad (2).$$

If the conditions are satisfied, even when a gas space is formed below the first hole 25Ha of the porous member 25 (on the side of the substrate P), the gas in the gas space is prevented from moving into (entering) the passage space 24 above the porous member 25 via the first hole 25Ha. That is, an interface between the liquid LQ and the gas can be maintained inside the first hole 25Ha of the porous member 25, and thus the gas can be prevented from entering the passage space 24 from the gas space under the porous member 25 via the first hole 25Ha, by optimizing the hole diameter "d" of the porous member 25, the contact angle (affinity) θ of the porous member 25 with respect to the liquid LQ, the surface tension "γ" of the liquid LQ, and the pressures Pa and Pc so as to satisfy the above conditions. Meanwhile, since the liquid space is formed below the second hole 25Hb of the porous member 25 (on the side of the substrate P), only the liquid LQ can be recovered via the second hole 25Hb of the porous member 25.

In the present embodiment, since the pressure Pa of the space below the porous member 25, the hole diameter "d", the contact angle θ of the porous member 25 (internal surface of the hole 25H) with respect to the liquid LQ, and the surface tension "γ" of the liquid (pure water) LQ are almost constant, the immersion mechanism 1 controls the suction power of the liquid recovery device 21 to regulate the pressure Pc of the passage space 24 above the porous member 25 so as to satisfy the above conditions.

In the above Expression (1), the greater the absolute value of (Pa−Pc), that is, the greater the absolute value of ((4×γ×cos θ)/d), the easier the control of the pressure Pc to satisfy the above conditions. Thus, it is desirable that the hole diameter d be made as small as possible, and the contact angle θ of the porous member 25 with respect to the liquid LQ be made as small as possible. In the present embodiment, the porous member 25 has lyophilicity to the liquid LQ, and has a sufficiently small contact angle θ.

Furthermore, referring to FIG. 3A, each hole formed in the porous member 25 is formed so that the aperture diameter on the side of the top face and the aperture diameter on the side of the bottom face in the porous member 25 may become substantially the same. However, the aperture diameter on the side of the top face of each hole of the porous member 25 may be made different from the aperture diameter on the side of the bottom face. For example, experiments show that, if the aperture diameter on the side of the top face of each hole of the porous member 25 is made smaller than the aperture diameter on the side of the bottom face as shown in FIG. 3B, the absolute value of the above-mentioned (Pa−Pc) can be made greater.

As such, in the present embodiment, only the liquid LQ is recovered from the hole 25H of the porous member 25 by controlling the pressure difference (pressure difference between the top face and bottom face of the porous member 25) between the passage space 24 above the porous member 25 and the space below the porous member so as to satisfy the above conditions, in a state where the porous member 25 becomes wet (in a state where the top face of the porous member 25 is covered with the liquid LQ). As a result, generation of vibrations resulting from sucking the liquid LQ and gas together can be suppressed.

Furthermore, the liquid LQ in the passage space 24 moves into the space below the porous member 25 by performing control so as to satisfy the above conditions. That is, if the above conditions are satisfied, the liquid LQ in the passage space (recovery passage) 24, that is, a space above the porous member 25, will not drip into the space below the porous member 25 via the porous member 25.

Referring to FIG. 2, although the gas space is formed in a portion of the passage space 24, it is more desirable to fill the whole passage space 24 with the liquid LQ.

Next, the temperature regulating mechanism 60 will be described. The temperature regulating mechanism 60 is a mechanism for suppressing a change in the temperature of the nozzle member 70 after the liquid LQ in the optical path space K1 has been removed. When the substrate P is irradiated with the exposure light EL, the liquid LQ is held between the projection optical system PL and nozzle member 70, and the substrate P, and thereby the liquid LQ is filled into the predetermined space K2 including the optical path space K1. However, there is a possibility that, after the liquid LQ in the predetermined space K2 including the optical path space K1 has been removed (after formation of an immersion space has been deactivated), at least a portion of the liquid LQ in contact with the nozzle member 70 may evaporate. There is also a possibility that the nozzle member 70 may change (drop) in temperature due to the heat of evaporation generated by evaporation of the liquid LQ. The temperature regulating mechanism 60 suppresses a drop in the temperature of the nozzle member 70 caused by the heat of evaporation generated by evaporation of at least a portion of the liquid LQ in contact with the nozzle member 70 after the liquid LQ in the predetermined space K2 including the optical path space K1 has been removed.

Referring to FIG. 2, the temperature regulating mechanism 60 is connected to the liquid supply device 11 and the recovery passage 24 provided in the nozzle member 70, and is equipped with the second supply pipe 15 which supplies the liquid LQ delivered from the liquid supply device 11 to the recovery passage 24. That is, the liquid supply device 11 can supply the liquid LQ to the recovery passage 24 via the second supply pipe 15. The temperature regulating mechanism 60 supplies the liquid LQ for regulating the temperature of the nozzle member 70 to the recovery passage 24 via the second supply pipe 15 from the liquid supply device 11. Furthermore, the liquid LQ which is delivered from the liquid supply device 11 and supplied to the optical path space K1 from the supply port 12, and the liquid LQ which is delivered from the liquid supply device 11 and supplied to the recovery passage 24 from the second supply pipe 15 for regulating the temperature of the nozzle member 70 are the same liquids (pure water).

Furthermore, the temperature regulating mechanism 60 is equipped with a flow rate controller 16 called a mass flow controller, which is provided in the middle of the second supply pipe 15 to control the amount per unit time of liquid LQ supplied to the recovery passage 24 from the liquid supply device 11. The operation of the flow rate controller 16 is controlled by the control unit CONT.

Furthermore, the temperature regulating mechanism 60 is equipped with a temperature regulator 17 which is provided in the middle of the second supply pipe 15, and is capable of regulating the temperature of the liquid LQ supplied to the recovery passage 24 from the liquid supply device 11. The operation of the temperature regulator 17 is controlled by the control unit CONT. The temperature regulator 17 is a temperature regulator which is separate from the temperature regulating unit 18 provided in the liquid supply device 11, and the control unit CONT can independently control the operation of the temperature regulator 17 and the operation of the temperature regulating unit 18. The temperature regulator 17 is arranged between the liquid supply device 11 including the temperature regulating unit 18 and the nozzle member 70, and can further regulate the temperature of the liquid LQ supplied via the temperature regulating unit 18 from the liquid supply device 11.

Next, a method of exposing a pattern image of the mask M to the substrate P by using the exposure apparatus EX having the above-described configuration will be described.

In order to perform immersion exposure of the substrate P, the control unit CONT drives the liquid supply device 11 to supply a predetermined amount of liquid LQ per unit time to the predetermined space K2 including the optical path space K1 from the supply port 12, and drives the liquid recovery device 21 of the immersion mechanism 1 to recover a predetermined amount of liquid LQ per unit time via the recovery port 22 from the predetermined space K2 including the optical path space K1, thereby filling the predetermined space K2 including the optical path space K1 with the liquid LQ to locally form the immersion region LR of the liquid LQ.

After the liquid LQ delivered from the liquid supply device 11 under the control of the control unit CONT flows through the first supply pipe 13, the liquid is supplied to the space between the front optical element LS1 of the projection optical system PL, and the bottom plate 71 via the supply passage 14 of the nozzle member 70 from the supply port 12. The liquid LQ supplied from the supply port 12 reaches the opening 74 after it flows on the top face 71A of the bottom plate 71. Thereafter, the liquid LQ flows into the predetermined space K2 between the nozzle member 70 and the substrate P via the opening 74, and then the liquid LQ is filled into the predetermined space K2 including the optical path space K1 for the exposure light EL. As such, the immersion mechanism 1 supplies the liquid LQ to the space between the front optical element LS1 and the bottom plate 71 from the supply port 12, thereby filling the optical path space K1 for the exposure light EL between the front optical element LS1 and the substrate P with the liquid LQ.

The liquid recovery device 21 including a vacuum system driven under the control of the control unit CONT forms a negative pressure in the recovery passage 24, thereby recovering the liquid LQ which exists in the predetermined space K2 including the optical path space K1 via the recovery port 22 in which the porous member 25 is arranged. After the liquid LQ in the predetermined space K2 flows into the recovery passage 24 via the recovery port 22 of the nozzle member 70 and flows through the recovery pipe 23, the liquid is recovered by the liquid recovery device 21.

Furthermore, the liquid recovery device 21 regulates the pressure (pressure (negative pressure)) on the top face of the porous member 25) of the passage space 24 by using a pressure regulating mechanism (not shown), thereby recovering only the liquid LQ via the porous member 25 from the recovery port 22.

The control unit CONT projects and exposes the pattern image of the mask M onto the substrate P via the projection optical system PL and the liquid LQ in the optical path space K1 while the projection optical system PL and the substrate P are moved relative to each other, in a state in which the optical path space K1 for the exposure light EL is filled with the liquid LQ. As described above, since the exposure apparatus EX of the present embodiment is a scan type exposure apparatus with the Y-axis direction as its scanning direction, the control unit CONT controls the mask stage MST and the substrate stage ST1 to irradiate the substrate P with the exposure light EL while moving the mask M and the substrate P in the Y-axis direction, respectively, thereby exposing the substrate P. When the substrate P is irradiated with the exposure light EL, the liquid LQ is held between the nozzle member 70 and the substrate P to fill the optical path space K1.

In addition, the immersion region LR of the liquid LQ is formed on the measurement stage ST2 before or after exposure of the substrate P, and the control unit CONT measures exposure treatment if needed by using a measuring device mounted to the measurement stage ST2. As described above, the immersion region LR is movable between the top face 57 of the substrate stage ST1 and the top face 59 of the measurement stage ST2. For example, even when the substrate stage ST1 is not under the projection optical system PL for the purpose of replacement of the substrate P, etc., the measurement stage ST2 is caused to face the bottom face of the front optical element LS1 of the projection optical system PL during replacement of the substrate stage ST1, so that the optical path space K1 can continue to be filled with the liquid LQ by using the immersion mechanism 1. Also, when the measurement stage ST2 has faced the front optical element LS1, a predetermined measurement operation is performed if needed, using a measuring device and/or a measuring member (for example, a reference mark, etc.), which is mounted to the measurement stage ST2. Furthermore, when the substrate stage ST1 is arranged in the position which faces the front optical element LS1, for example, for the exposure operation of the substrate P, the measurement stage ST2 is moved to a predetermined position (retreating position) away from the front optical element LS1. As such, in the present embodiment, at least one of the substrate stage ST1 and the measurement stage ST2 is arranged under the projection optical system PL, so that the optical path space K1 can continue to be filled with the liquid LQ (that is, the immersion space (immersion region LR) can be maintained (held) on the light emission side of the front optical element LS1).

Figure 5A:
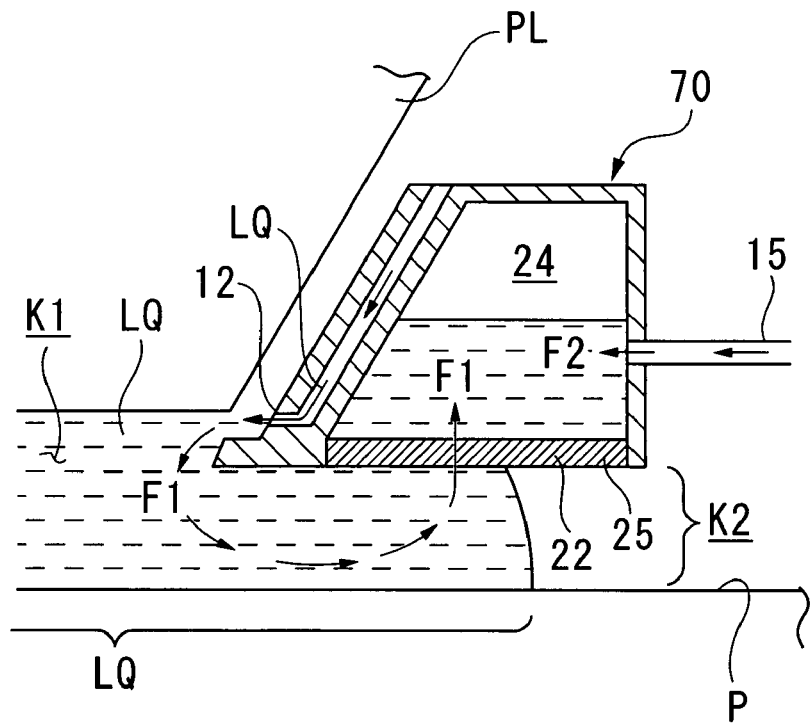
FIG. 5A is a view for explaining the operation of the temperature regulating mechanism.

As shown in the schematic diagram of FIG. 5A, during exposure of the substrate P etc., a predetermined amount F1 of liquid LQ per unit time is supplied to the predetermined space K2 including the optical path space K1 from the supply port 12. In the following description, the amount of liquid per unit time supplied to the optical path space K1 (predetermined space K2) from the supply port 12 is appropriately called "first amount F1."

The immersion mechanism 1 recovers the liquid LQ which exists in the optical path space K1 (predetermined space K2) via the recovery port 22 at a predetermined amount per unit time. The immersion mechanism 1 makes the supply amount (first amount F1) per unit time of liquid supplied to the optical path space K1 (predetermined space K2) from the supply port 12 substantially equal to the recovery amount of liquid per unit time to be recovered from the optical path space K1 (predetermined space K2) via the recovery port 22. That is, the amount of the liquid LQ which flows into the recovery passage 24 via the recovery port 22 from the predetermined space K2 is substantially equal to the first amount F1. As a result, the optical path space K1 is filled with the liquid LQ while the supply amount of liquid to the optical path space K1 and the recovery amount of liquid from the optical path space K1 are balanced, and occurrence of drawbacks, such as enlargement of the immersion region LR, leakage of the liquid LQ, or depletion (liquid run-out) of the liquid LQ is prevented.

Furthermore, in the present embodiment, the control unit CONT continues supplying a predetermined amount F2 of liquid LQ per unit time to the recovery passage 24 via the second supply pipe 15 from the liquid supply device 11, while the optical path space K1 of the exposure light EL is filled with the liquid LQ, as shown in FIG. 5A. That is, the control unit CONT continues supplying the liquid LQ to the recovery passage 24 from the liquid supply device 11 via the second supply pipe 15, which constitutes the temperature regulating mechanism 60, even while the substrate P is immersion-exposed. In the following description, the supply amount per unit time of liquid supplied from the second supply pipe 15 (temperature regulating mechanism 60) to the recovery passage 24 (nozzle member 70) in a state where the optical path space K1 is filled with the liquid LQ is appropriately called "second amount F2."

Accordingly, in order to perform immersion exposure of the substrate P, while the optical path space K1 is filled with the liquid LQ, the liquid LQ with the amount of the sum (F1+F2) of the first amount F1 and the second amount F2 will flow into the recovery passage 24. The liquid recovery device 21 forms a negative pressure in the recovery passage 24 with a suction power W1 according to the amount (F1+F2) of the liquid LQ which flows into the recovery passage 24, thereby making the liquid LQ in the predetermined space K2 flow into the recovery passage 24 via the recovery port 22 to recover the liquid, and recovering the liquid LQ which has flowed into the recovery passage 24 from the second supply pipe 15.

As shown in FIG. 5A, even in a case where the liquid LQ is supplied to the recovery passage 24 from the second supply pipe 15 of the temperature regulating mechanism 60 in a state where the immersion region LR is formed, the pressure (pressure on the top face of the porous member 25) Pc of the passage space 24 is controlled by the liquid recovery device 21 so as to satisfy the above Expression (1).

Here, the temperature of the liquid LQ supplied from the supply port 12 to the optical path space K1 (predetermined space K2), and the temperature of the liquid LQ supplied to the recovery passage 24 via the second supply pipe 15 may be set to different values. However, in the present embodiment, the above temperatures are regulated to almost the same value.

There is a case that, after predetermined treatment, such as exposure treatment of the substrate P, is performed in a state where the optical path space K1 is filled with the liquid LQ, the whole liquid LQ that is filling the optical path space K1 is removed for maintenance of the apparatus, for example. In the following description, removing (recovering) the whole liquid LQ that is filling the predetermined space K2 including the optical path space K1 is appropriately called "full recovery."

When the liquid LQ in the optical path space K1 is recovered fully, the control unit CONT controls the valve mechanism 13B to close the passage of the first supply pipe 13, thereby stopping supply of the liquid LQ to the optical path space K1 from the supply port 12. On the other hand, the control unit CONT continues driving of the liquid recovery device 21. Since the negative pressure of the recovery passage 24 is maintained by continuing driving of the liquid recovery device 21, the liquid LQ in the predetermined space K2 including the optical path space K1 is recovered via the recovery port 22, and then the optical path space K1 (predetermined space K2) will be in a state where the liquid LQ has been recovered fully.

Figure 4:
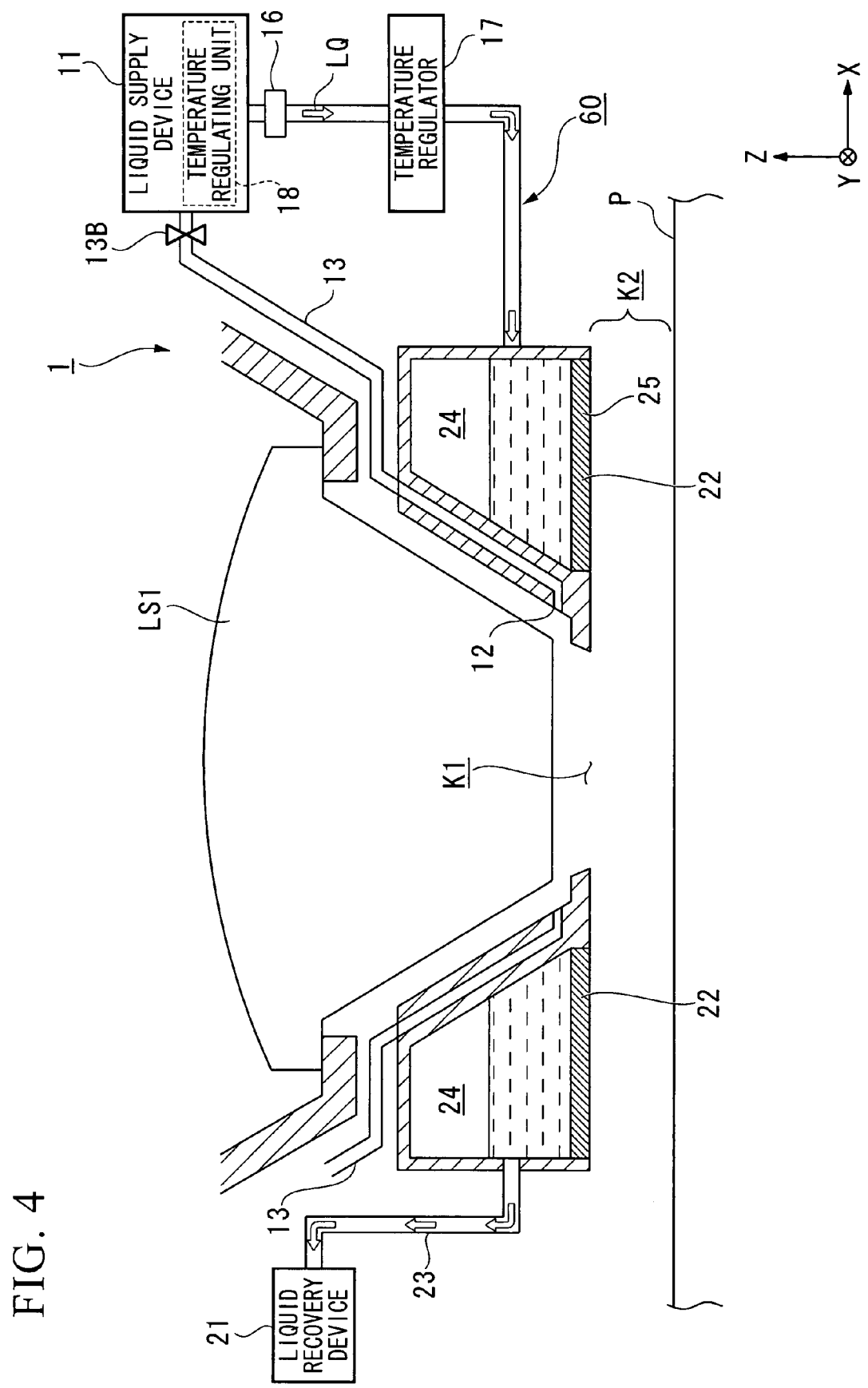
FIG. 4 is a view for explaining the immersion mechanism and the temperature regulating mechanism.

FIG. 4 is a view showing a state after the liquid LQ in the predetermined space K2 including the optical path space K1 has been recovered fully. The control unit CONT continues supplying the liquid LQ to the recovery passage 24 (nozzle member 70) via the second supply pipe 15 from the liquid supply device 11 even in a state where the liquid LQ in the optical path space K1 is recovered fully, and thus there is no liquid LQ in the optical path space K1 (predetermined space K2). That is, in the present embodiment, the liquid LQ always continue to be supplied to the recovery passage 24 (nozzle member 70) via the second supply pipe 15 from the liquid supply device 11.

When the liquid LQ is filled into the predetermined space K2 including the optical path space K1, the temperature of the nozzle member 70 is regulated by the liquid LQ. However, as described above, when the liquid LQ in the optical path space K1 (predetermined space K2) is removed, there is a possibility that the temperature of the nozzle member 70 may fall due to the heat of evaporation generated by evaporation of the liquid LQ in contact with the nozzle member 70. If the bottom face of the nozzle member 70, the porous member 25, etc. are lyophilic, there is a high possibility that the liquid LQ will remain on the nozzle member 70. Furthermore, since there is a high possibility that the liquid LQ will remain within the supply passage 14 and recovery passage 24 when the supply operation and recovery operation of the liquid LQ by the immersion mechanism 1 are stopped, a possibility that the nozzle member 70 will be cooled down becomes high due to the heat of evaporation of the remaining liquid LQ. If the temperature of the nozzle member 70 falls and the supply operation of the liquid LQ to the optical path space K1 from the supply port 12 is resumed, there is a possibility that the temperature of the liquid LQ to be supplied may become lower than a desired temperature, the optical path of the exposure light EL which passes through the liquid LQ may be changed, or the substrate P in contact with the liquid LQ may be deformed thermally, and consequently the exposure precision via the liquid LQ may deteriorate. Furthermore, there is also a possibility that various members, for example, the front optical element LS1, which are arranged in the vicinity of the nozzle member 70, may be cooled down, and consequently desired imaging characteristics may not be longer obtained. Furthermore, there is also a possibility that peripheral devices and members may be affected such that the environment (temperature) where the exposure apparatus EX is placed may change, or the measurement precision of an optical measuring device, such as a laser interferometer, may deteriorate, or a supporting member (a body of the exposure apparatus EX) which supports the projection optical system PL may be deformed thermally.

Thus, the control unit CONT continues supplying the liquid LQ to the recovery passage 24 of the nozzle member 70 via the second supply pipe 15 of the temperature regulating mechanism 60 even while there is no liquid LQ in the optical path space K1, thereby controlling a temperature change (drop) in the nozzle member 70. Furthermore, even in this case, the negative pressure of the recovery passage 24 is maintained by the liquid recovery device 21 so as to satisfy the above Expression (1). Thus, the liquid LQ supplied to the recovery passage 24 via the second supply pipe 15 from the liquid supply device 11 is recovered by the liquid recovery device 21 without dripping from the porous member 25 to the lower predetermined space K2. As such, since the liquid LQ for temperature regulation continues flowing into the nozzle member 70 even after the liquid LQ in the optical path space K1 has been recovered fully, the temperature change (temperature drop) of the nozzle member 70 can be suppressed.

In addition, in the present embodiment, the control unit CONT makes the amount F3 per unit time of the liquid LQ supplied to the recovery passage 24 from the liquid supply device 11 after the liquid LQ has been removed from the optical path space K1 greater than the amount F2 (second amount) per unit time of the liquid LQ supplied to the recovery passage 24 from the liquid supply device 11 during exposure of the substrate P, etc. In the following description, the supply amount per unit time of liquid supplied to the recovery passage 24 (nozzle member 70) from the second supply pipe 15 (temperature regulating mechanism 60) in a state where there is no liquid LQ in the optical path space K1 is appropriately called "third amount F3."

Figure 5B:
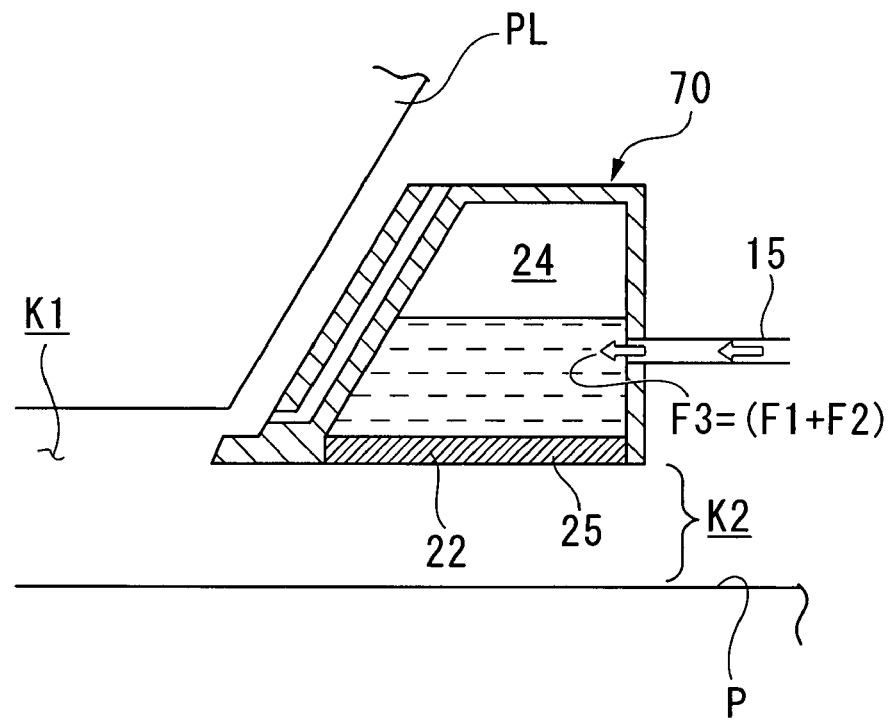
FIG. 5B is a view for explaining the operation of the temperature regulating mechanism.

Specifically, as shown in the schematic diagram of FIG. 5B, the control unit CONT regulates the third amount F3 using the flow rate controller 16 so that the third amount F3 when the liquid LQ is supplied to the recovery passage 24 from the liquid supply device 11 after the liquid LQ has been removed from the optical path space K1 may be substantially equal to the sum of the second amount F2 when the liquid LQ is supplied to the recovery passage 24 from the liquid supply device 11 during exposure of the substrate P, etc., and the first amount F1 when the liquid LQ is supplied to the optical path space K1 from the supply port 12, that is, so that the following condition: $F3=F1+F2$ may be satisfied. The liquid LQ in the amount ($=F1+F2$) of the sum of the first amount F1 and the second amount F2 as the third amount F3 is supplied to the recovery passage 24 via the second supply pipe 15 after full recovery of the liquid LQ. As a result, even if the suction power W1 of the liquid recovery device 21 is not changed greatly in a state where there exists or is no liquid LQ in the optical path space K1, the liquid recovery device 21 can maintain the negative pressure state of the recovery passage 24 so as to satisfy the above Expression (1).

When the optical path space K1 is filled with the liquid LQ again, for example, after predetermined treatment, such as maintenance, has been performed in a state where the liquid LQ in the optical path space K1 has been recovered fully, the control unit CONT drives the valve mechanism 13B to open the passage of the first supply pipe 13, thereby starting supply of the liquid LQ to the optical path space K1 from the supply port 12. The liquid LQ is supplied to the optical path space K1 from the supply port 12 by the first amount F1. Furthermore, the control unit CONT controls the flow rate controller 16 to supply the liquid LQ to the recovery passage 24 via the second supply pipe 15 by the second amount F2.

As described above, since the temperature regulating mechanism 60 for suppressing a change in the temperature of the nozzle member 70 is provided, deterioration of exposure precision resulting from a change in the temperature of the nozzle member 70 can be prevented. Since the temperature regulating mechanism 60 continues supplying the liquid LQ to the recovery passage 24 of the nozzle member 70 in order to regulate the temperature of the nozzle member 70 even in a state where there is no liquid LQ in the optical path space K1 after the liquid LQ in the optical path space K1 has been removed, it is possible to suppress a drop in the temperature of the nozzle member 70 caused by the heat of evaporation of the liquid LQ after the liquid LQ in the optical path space K1 has been removed.

Furthermore, a great change in the temperature of the nozzle member 70 can be suppressed by making the temperature of the liquid LQ supplied to the recovery passage 24 via the second supply pipe 15 from the liquid supply device 11 in order to regulate the temperature of the nozzle member 70 in a state where there is no liquid LQ in the optical path space K1 substantially equal to the temperature of the liquid LQ supplied to the optical path space K1 via the supply port 12 when the substrate P is exposed. Furthermore, the regulated amount (controlled amount) of the temperature regulating unit 18 will be changed when the temperature of the liquid LQ to be supplied is changed. However, since a certain period of time is required until the temperature of the liquid LQ to be delivered from the temperature regulating unit 18 reaches a desired temperature (becomes stable) after the regulated amount of the temperature regulating unit 18 is changed, it may be necessary to provide a latency time until the temperature of the liquid LQ is stabilized. However, since it is not necessary to provide the above-mentioned latency time by making the temperature of the liquid LQ supplied to the recovery passage 24 in order to regulate the temperature of the nozzle member 70 almost equal the temperature of the liquid LQ supplied to the optical path space K1 from the supply port 12 in order to fill the optical path space K1, the operation rate of the exposure apparatus EX can be improved.

Furthermore, in the present embodiment, since the liquid supply device 11 including the temperature regulating unit 18 continues to be always driven even when the liquid LQ exists in the optical path space K1 or even when there is no liquid, the operation rate of the exposure apparatus EX can be improved. That is, there is a possibility that it may be necessary to provide a latency time until the states (temperature, cleanness, etc.) of the liquid LQ to be delivered from the liquid supply device 11 are stabilized when the operation of the liquid supply device 11 is stopped once and then the operation is resumed. However, by continuing driving of the liquid supply device 11, it is not necessary to provide the above-described latency time, for example, even when the operation which supplies the liquid LQ to the optical path space K1 with no liquid LQ is resumed.

Furthermore, since the liquid LQ whose temperature has been regulated by the temperature regulating unit 18 or the temperature regulator 17 will be supplied to the nozzle member 70 in a large amount when there is no liquid LQ in the optical path space K1 by making the third amount F3 of the liquid LQ supplied to the recovery passage 24 from the liquid supply device 11 after the liquid LQ is removed from the optical path space K1 greater than the second amount F2 of the liquid LQ supplied to the recovery passage 24 from the liquid supply device 11 during exposure of the substrate P, a change in the temperature of the nozzle member 70 can be suppressed effectively.

Furthermore, since the third amount F3 of the liquid LQ supplied to the recovery passage 24 from the liquid supply device 11 after the liquid LQ is removed from the optical path space K1 is made substantially equal to the sum of the first amount F1 of the liquid LQ supplied to the recovery passage 24 from the liquid supply device 11 during exposure of the substrate P, and the second amount F2 of the liquid LQ supplied to the optical path space K1 from the supply port 12, it is not necessary to change the suction power W1 of the liquid recovery device 21 greatly before and after the liquid LQ in the optical path space K1 is removed. When the suction power W1 of the liquid recovery device 21 is changed, there is a possibility that a drawback may occur in that it is necessary to provide a latency time until the operation of the liquid recovery device 21 is stabilized. However, in the present embodiment, since it is not necessary to change the suction power W1 of the liquid recovery device 21 greatly, a decline in the operation rate of the exposure apparatus EX can be suppressed.

Meanwhile, in the present embodiment, the third amount F3 is substantially equal to the sum of the first amount F1 and the second amount FIG. 2. As a result, it is not necessary to change the suction power W1 of the liquid recovery device 21 greatly in a state where there is no or exists liquid LQ in the optical path space K1. The amount of supply of the liquid LQ is not limited thereto. For example, the liquid LQ may be supplied to the optical path space K1 from the supply port 12 by the first amount F1 in order to fill the optical path space K1 with the liquid LQ. At this time, the liquid LQ may not be supplied to the recovery passage 24 via the second supply pipe 15 (second amount F2=0). When supply of the liquid LQ from the supply port 12 is stopped (first amount F1=0) in order to remove the liquid LQ in the optical path space K1, the second amount F2 of the liquid LQ supplied to the recovery passage 24 via the second supply pipe 15 from the liquid supply device 11 may be made substantially equal to the first amount F1. By doing so, the amount of the liquid LQ which flows into the recovery passage 24 can be made to become the first amount F1 even in a state where there is no or there exists liquid LQ in the optical path space K1.

Furthermore, when the immersion region LR in a desired state is to be formed, there is a possibility that the first amount F1 when the liquid LQ is supplied to the optical path space K1 from the supply port 12 should be regulated depending on substrate conditions including a movement condition including the traveling speed of the substrate P when the substrate P is exposed, a contact angle condition of a film forming the surface of the substrate P with respect to the liquid LQ, etc. If the first amount F1 is small, in order not to change the recovery power (suction power) W1 of the liquid recovery device 21 after the liquid LQ is removed from the optical path space K1, it is necessary to reduce the third amount F3 of the liquid LQ supplied to the recovery passage 24 according to the first amount F1 for regulating the temperature of the nozzle member 70. Therefore, there is a possibility that the temperature change (temperature drop) of the liquid LQ cannot be suppressed sufficiently. Thus, like the above-described embodiment, the liquid LQ continues to be supplied to the recovery passage 24 from the liquid supply device 11 for regulating the temperature of the nozzle member 70 even when the liquid LQ exists in the optical path space K1. As a result, even if the first amount F1 is small temporarily, the third amount F3 can be made sufficiently large with the recovery power W1 of the liquid recovery device 21 kept substantially constant by increasing the second amount F2.

In the above description, the amounts of supply (F1 to F3) of the liquid LQ are regulated without greatly changing the suction power W1 of the liquid recovery device 21 so as to satisfy the above-mentioned Expression (1). However, the suction power W1 of the liquid recovery device 21 may be regulated, or both the suction power W1 of the liquid recovery device 21 and the amounts of supply (F1 to F3) of the liquid LQ may be regulated.

Furthermore, in the above-described embodiment, the liquid LQ supplied to the optical path space K1 from the supply port 12 and the liquid LQ supplied to the recovery passage 24 from the second supply pipe 15 are delivered from the same liquid supply device 11. Therefore, when the liquid LQ is supplied from the supply port 12, even if the temperature regulator 17 provided in the second supply pipe 15 is not necessarily driven, the temperature of the liquid LQ supplied to the optical path space K1 from the supply port 12 and the temperature of the liquid LQ supplied to the recovery passage 24 from the second supply pipe 15 can be made substantially equal to each other by the temperature regulating unit 18. On the other hand, when there is no liquid LQ in the optical path space K1, the temperature of the liquid LQ to be delivered from the liquid supply device 11 including the temperature regulating unit 18 and supplied to the recovery passage 24 of the nozzle member 70 may be further regulated by the temperature regulator 17. Furthermore, the temperature regulator 17 may be omitted.

When there is no liquid LQ in the optical path space K1, the temperature regulating mechanism 60 may make the temperature of the liquid LQ supplied to the recovery passage 24 for regulating the temperature of the nozzle member 70 higher than the temperature of the liquid LQ supplied to the optical path space K1 from the supply port 12. For example, when the temperature of the nozzle member 70 falls significantly due to heat of evaporation, a change in the temperature of the nozzle member 70 can be further suppressed by supplying the liquid LQ with comparatively high temperature to the nozzle member 70 (recovery passage 24). In this case, the temperature of the liquid LQ supplied to the nozzle member 70 (recovery passage 24) via the second supply pipe 15 can be made high using the temperature regulator 17 without changing the controlled amount of the temperature regulating unit 18. Also, when supply of the liquid LQ from the supply port 12 is resumed, the liquid LQ whose temperature has been regulated by the temperature regulating unit 18 can be immediately supplied to the optical path space K1.

The liquid LQ supplied to the recovery passage 24 for regulating the temperature of the nozzle member 70 and the liquid LQ supplied to the optical path space K1 from the supply port 12 may be different kinds of liquids. In the above-described embodiment, the liquid LQ supplied to the optical path space K1 from the supply port 12 is pure water. However, for example, a liquid with larger specific heat than pure water may be used as the liquid LQ supplied to the recovery passage 24 for regulating the temperature of the nozzle member 70.

Second Embodiment

Figure 6:
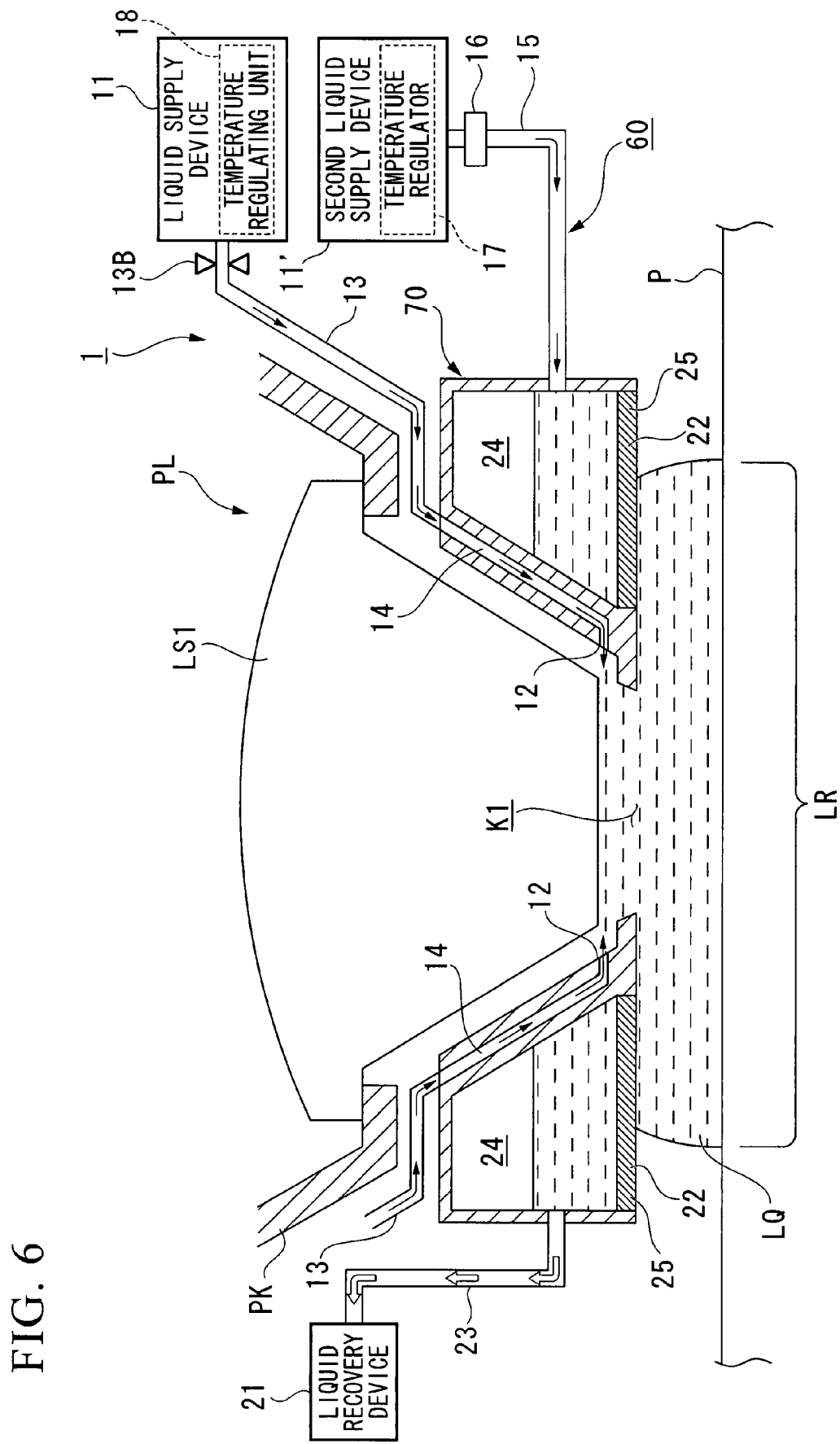
FIG. 6 is an enlarged view showing principal parts of an exposure apparatus according to a second embodiment.

A second embodiment will be described referring to FIG. 6. In the following description, the same components as or equivalent to those of the above-described embodiment are denoted by the same reference numerals, and description thereof will be simplified or omitted.

The above-described first embodiment is configured such that the liquid supply device 11 supplies the liquid LQ to the optical path space K1 via the supply port 12 and supplies the liquid LQ to the recovery passage 24 (space on the side of the top face of the porous member 25) via the second supply pipe 15, and such that the immersion mechanism 1 and the temperature regulating mechanism 60 also serve as the liquid supply device 11. However, as shown in FIG. 6, a second liquid supply device 11' which supplies the liquid LQ to the nozzle member 70 (recovery passage 24) in order to regulate the temperature of the nozzle member 70 may be provided independently from the liquid supply device 11 which supplies the liquid LQ for filling the optical path space K1. Also, regulation of the temperature of the liquid LQ supplied to the optical path space K1 from the liquid supply device 11 and regulation of the temperature of the liquid LQ supplied to the recovery passage 24 from the second liquid supply device 11' may be performed independently. Using the temperature regulator 17, the second liquid supply device 11' may make the temperature of the liquid LQ for regulating the temperature of the nozzle member 70 equal to the temperature of the liquid LQ supplied to the optical path space K1 from the supply port 12, and higher than the temperature of the liquid LQ supplied to the optical path space K1.

In the above-described first and second embodiments, the liquid LQ for temperature regulation is allowed to flow to the recovery passage 24 on the side of the top face of the recovery port 22 (porous member 25) at the bottom face of the nozzle member 70 that faces the substrate P. However, it is desirable to allow the liquid LQ for temperature regulation to flow to other spaces inside the nozzle member 70 as well as the top side of the porous member 25 of the recovery port 22, thereby reducing and preventing any influence of evaporation of the liquid LQ at the bottom face of the nozzle member 70.

Third Embodiment

Figure 7:
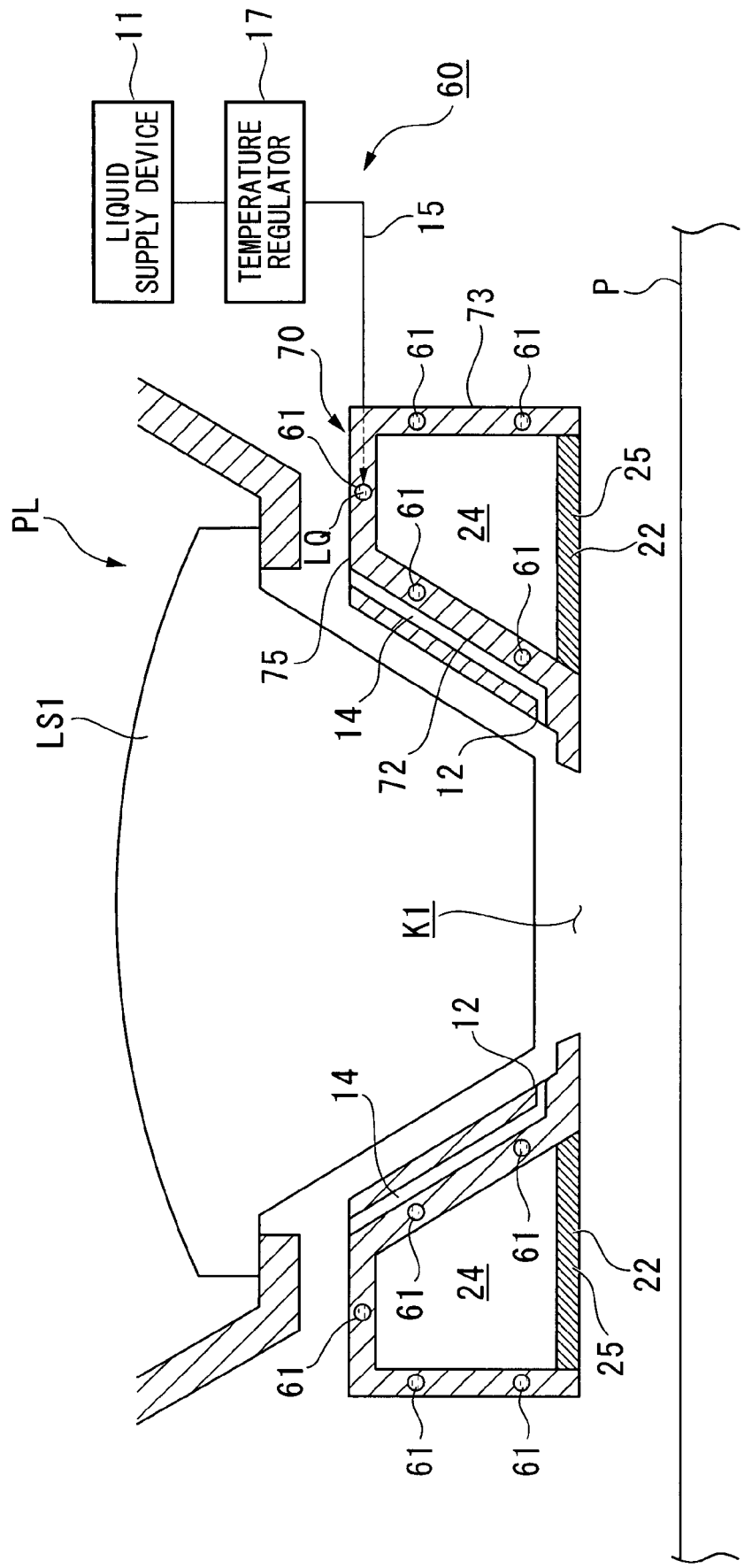
FIG. 7 is an enlarged view showing principal parts of an exposure apparatus according to a third embodiment.

A third embodiment will be described referring to FIG. 7. In the following description, the same components as or equivalent to those of the above-described embodiment are denoted by the same reference numerals, and description thereof will be simplified or omitted. Referring to FIG. 7, the nozzle member 70 has an internal passage 61 through which the liquid LQ for adjusting the temperature of the nozzle member 70 flows, separately from the supply passage 14 connected to the supply port 12 for supplying the liquid LQ to the optical path space K1 and the recovery passage 24 connected to the recovery port 22 for recovering the liquid LQ in the optical path space K1. In the example shown in FIG. 7, the internal passage 61 is provided inside the inclined plate 72, the side plate 73, and the top plate 75 of the nozzle member 70. The internal passage 61 may be formed annularly inside the nozzle member 70 and may be formed spirally so as to surround the optical path space K1, for example. An inlet connected to the second supply pipe 15 is provided in a portion of the internal passage 61, and the liquid supply device 11 which constitutes the temperature regulating mechanism 60 supplies the liquid LQ to the internal passage 61 via the second supply pipe 15 and the inlet. Furthermore, an outlet for discharging the liquid LQ which has flowed through the internal passage 61 is provided at another portion of the internal passage 61. Also, the temperature regulating mechanism 60 can supply the liquid LQ from the inlet to the internal passage 61 and discharge the liquid LQ from the outlet, thereby continuing allowing the liquid LQ for temperature regulation to flow to the internal passage 61.

The control unit CONT supplies the liquid LQ to the internal passage 61 after the liquid LQ in the optical path space K1 is removed. Furthermore, the control unit CONT supplies the liquid LQ to the internal passage 61 even in a state where the liquid LQ exists in the optical path space K1. Furthermore, the control unit CONT can regulate the temperature of the liquid LQ supplied to the internal passage 61, using the temperature regulator 17 provided in the middle of the second supply pipe 15. The control unit CONT makes the temperature of the liquid LQ supplied to the internal passage 61 substantially equal to the temperature of the liquid LQ supplied to the optical path space K1 from the supply port 12, using the temperature regulator 17. A change in the temperature of the nozzle member 70 can be suppressed even by the configuration as described above.

In the third embodiment, the control unit CONT may supply the liquid LQ to the internal passage 61 after the liquid LQ in the optical path space K1 is removed, and may stop supply of the liquid LQ to the internal passage 61 in a state where the liquid LQ exists in the optical path space K1.

Furthermore, in the third embodiment, the control unit CONT makes the temperature of the liquid LQ supplied to the internal passage 61 higher than the temperature of the liquid LQ supplied to the optical path space K1 from the supply port 12, using the temperature regulator 17 provided in the middle of the second supply pipe 15.

In the third embodiment, similarly to the second embodiment, the liquid supply device which supplies the liquid LQ to the supply port 12, and the liquid supply device which supplies the liquid LQ to the internal passage 61 may be provided separately.

In the third embodiment, the liquid LQ supplied to the optical path space K1 from the supply port 12 and the liquid LQ supplied to the internal passage 61 may be different kinds of liquids. Furthermore, in order to regulate the temperature of the nozzle member 70, gas may be supplied to the internal passage 61.

Fourth Embodiment

Figure 8:
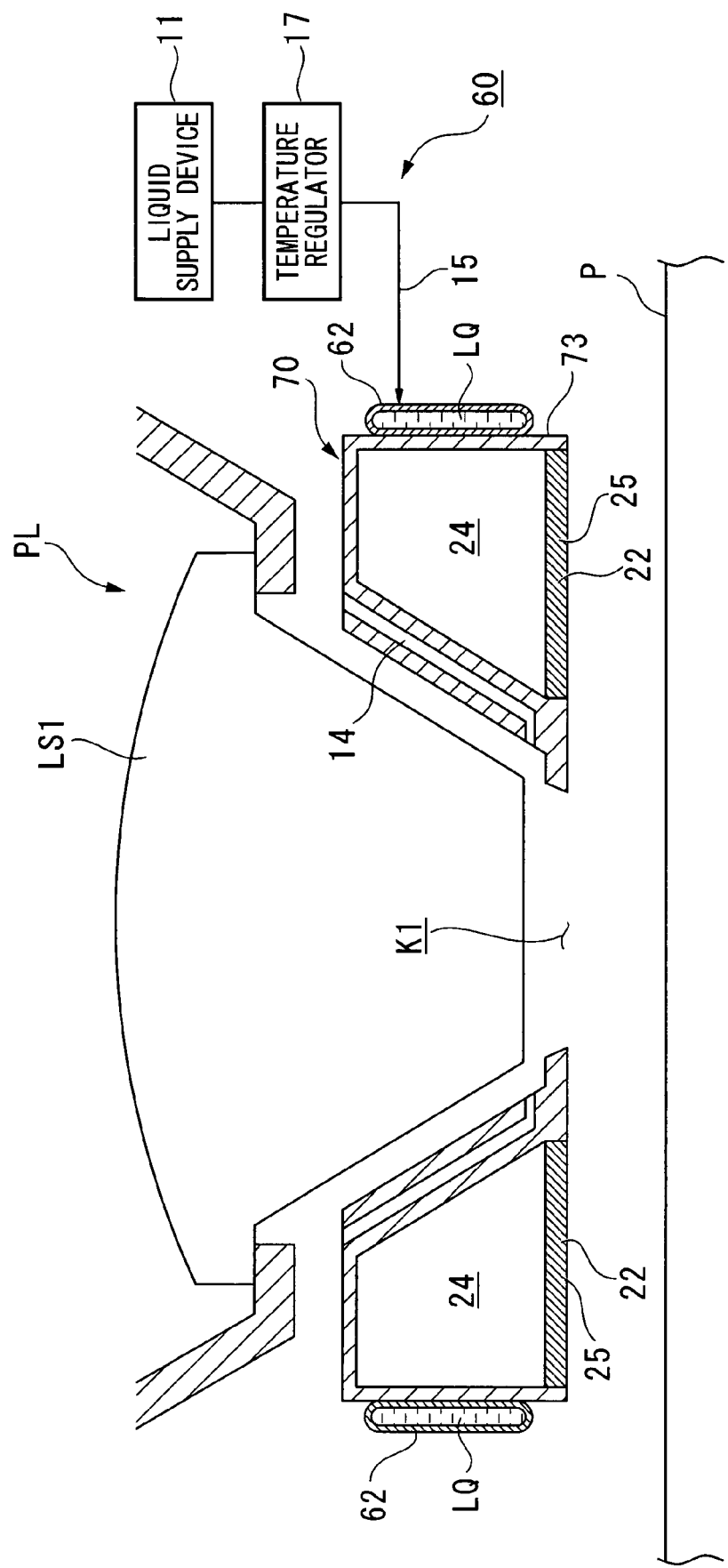
FIG. 8 is an enlarged view showing principal parts of an exposure apparatus according to a fourth embodiment.

A fourth embodiment will be described with reference to FIG. 8. In the following description, the same components as or equivalent to those of the above-described embodiment are denoted by the same reference numerals, and description thereof will be simplified or omitted. Referring to FIG. 8, the temperature regulating mechanism 60 has a jacket member 62 which faces a wall surface of the nozzle member 70, and through which the liquid LQ for regulating the temperature regulation of the nozzle member 70 flows.

The jacket member 62 is a tubular member which has an internal passage, and is provided so as to be wound around the side plate 73 of the nozzle member 70, and the jacket member 62 and the nozzle member 70 are in contact with each other. An inlet connected to the second supply pipe 15 is provided in a portion of the jacket member 62, and an outlet for discharging the liquid LQ inside the jacket member 62 is provided in the other portion of the jacket member. The liquid supply device 11 supplies the liquid LQ to the jacket member 62 via the second supply pipe 15 and the inlet. The control unit CONT supplies the liquid LQ to the jacket member 62 after the liquid LQ in the optical path space K1 is removed. Furthermore, the control unit CONT always supplies the liquid LQ to the jacket member 62 even in a state where the liquid LQ exists in the optical path space K1. Furthermore, the control unit CONT can regulate the temperature of the liquid LQ supplied to the jacket member 62, using the temperature regulator 17 provided in the middle of the second supply pipe 15. The control unit CONT makes the temperature of the liquid LQ supplied to the jacket member 62 substantially equal to the temperature of the liquid LQ supplied to the optical path space K1 from the supply port 12, using the temperature regulator 17. A change in the temperature of the nozzle member 70 can be suppressed even by the configuration as described above.

In the fourth embodiment, the control unit CONT may supply the liquid LQ to the jacket member 62 after the liquid LQ in the optical path space K1 is removed, and may stop supply of the liquid LQ to the jacket member 62 in a state where the liquid LQ exists in the optical path space K1.

Furthermore, in the fourth embodiment, the control unit CONT makes the temperature of the liquid LQ supplied to the jacket member 62 higher than the temperature of the liquid LQ supplied to the optical path space K1 from the supply port 12, using the temperature regulator 17 provided in the middle of the second supply pipe 15.

In the fourth embodiment, similarly to the second embodiment, the liquid supply device which supplies the liquid LQ to the supply port 12, and the liquid supply device which supplies the liquid LQ to the jacket member 62 may be provided separately.

In the fourth embodiment, the liquid LQ supplied to the optical path space K1 from the supply port 12 and the liquid LQ supplied to the jacket member 62 may be different kinds of liquids. Furthermore, in order to regulate the temperature of the nozzle member 70, gas may be supplied to the jacket member 62.

Fifth Embodiment

Figure 9:
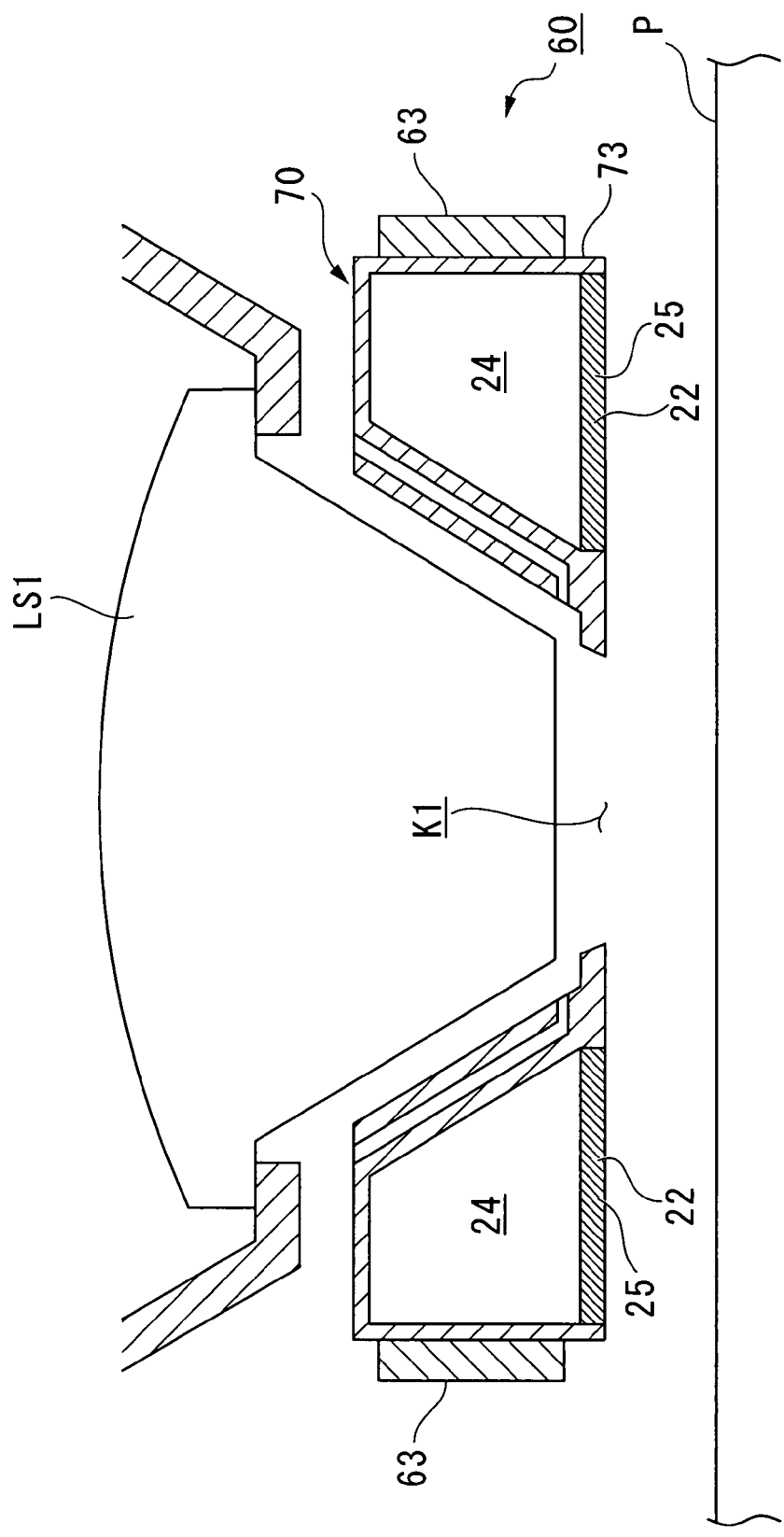
FIG. 9 is an enlarged view showing principal parts of an exposure apparatus according to a fifth embodiment.

Next, a fifth embodiment will be described referring to FIG. 9. In the following description, the same components as or equivalent to those of the above-described embodiment are denoted by the same reference numerals, and description thereof will be simplified or omitted. Referring to FIG. 9, the temperature regulating mechanism 60 has a heater 63 attached to the nozzle member 70.

The heater 63 is in contact with the side plate 73 of the nozzle member 70. The control unit CONT suppresses a change in the temperature of the nozzle member 70 using the heater 63 after the liquid LQ in the optical path space K1 is removed. When the temperature of the nozzle member 70 falls significantly due to the heat of evaporation generated by evaporation of the liquid LQ, the control unit CONT can suppress a drop in the temperature of the nozzle member 70 by warming the nozzle member 70 using the heater 63. The control unit CONT can regulate the temperature of the nozzle member 70 using the heater 63 even in a state where the liquid LQ exists in the optical path space K1. A change in the temperature of the nozzle member 70 can be suppressed even by the configuration as described above.

In the fifth embodiment, the control unit CONT may regulate the temperature of the nozzle member 70 using the heater 63 after the liquid LQ in the optical path space K1 is removed, and may not perform regulation of the temperature of the nozzle member 70 by the heater 63 in a state where the liquid LQ exists in the optical path space K1.

Sixth Embodiment

Figure 10:
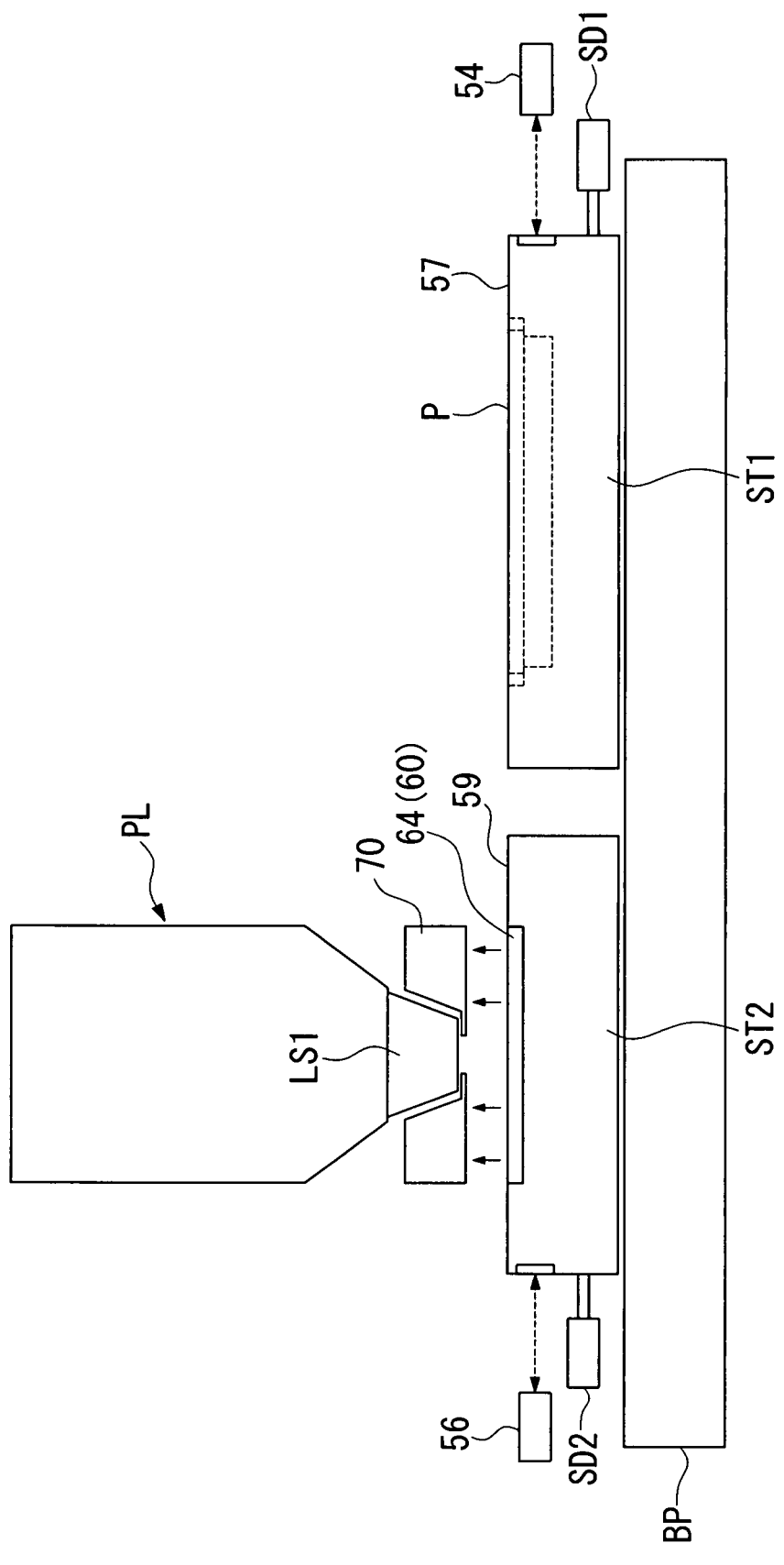
FIG. 10 is a view showing an exposure apparatus according to a sixth embodiment.

Next, a sixth embodiment will be described referring to FIG. 10. In the following description, the same components as or equivalent to those of the above-described embodiment are denoted by the same reference numerals, and description thereof will be simplified or omitted. Referring to FIG. 10, the temperature regulating mechanism 60 has a radiating part 64 which radiates heat toward the nozzle member 70. The radiating part 64 is provided in the measurement stage ST2. In the present embodiment, the radiating part 64 is provided on the top face 59 of the measurement stage ST2, which can face the nozzle member 70.

The radiating part 64 is constituted by, for example, a far-infrared ceramic heater, etc. Since the nozzle member 70 can be warmed by the heat radiated from the radiating part 64 by arranging the radiating part 64 in the position which faces the nozzle member 70, even in a case where the temperature of the nozzle member 70 falls significantly due to the heat of evaporation generated by evaporation of the liquid LQ, a drop in the temperature of the nozzle member 70 can be suppressed by warming the nozzle member 70 using the radiating part 64. A change in the temperature of the nozzle member 70 can be suppressed even by the configuration as described above.

The radiating part 64 may be provided in the substrate stage ST1, or may be provided in a predetermined supporting mechanism (including a movable body, etc.) other than the substrate stage ST1 and measurement stage ST2.

In the above-described first to sixth embodiments, the nozzle member 70 has both the supply port 12 and the recovery port 22. However, the form of the nozzle member 70 is not limited to the above-described one. For example, the temperature regulating mechanism in each of the above-described embodiments can be used when a change in the temperature of a nozzle member which has either a supply port or a recovery port can be suppressed.

Furthermore, in the above-described first to sixth embodiments, the immersion space forming member which fills the optical path space K1 with the liquid LQ to form an immersion space (K2) includes a portion of the immersion mechanism 1, i.e., the nozzle member 70. However, the present invention is not limited thereto. For example, the immersion space forming member may include members other than the nozzle member 70, and may have only either a supply port or a recovery port. Moreover, in the above-described first to sixth embodiments, formation of an immersion space is deactivated by removing the whole liquid LQ from the optical path space K1 (full recovery). However, the present invention is not limited thereto. For example, even when a portion of the liquid LQ in the optical path space K1 (or predetermined space K2) is removed so that the immersion region LR may be reduced compared with an immersion region at the time of exposure, formation of an immersion space may be deactivated. In short, when a change in the temperature of the immersion space forming member (nozzle member 70 etc.) exceeds a predetermined allowable range by removing at least a portion of the liquid LQ, formation of an immersion space may be deactivated.

In addition, the temperature regulating mechanisms 60 described in the above-described first to sixth embodiments may used in appropriate combinations. For example, as described in the first embodiment, the liquid LQ whose temperature has been regulated may be supplied to the recovery passage 24 of the nozzle member 70, and as described in the third embodiment, the internal passage 61 may be provided in the nozzle member 70 so that a fluid (liquid or gas) for temperature regulation may be caused to flow to the internal passage. Otherwise, the jacket member 62 as described in the fourth embodiment may be attached to the nozzle member 70, or the heater 63 as described in the fifth embodiment may be attached to the nozzle member. Furthermore, the nozzle member 70 may be warmed using the heat-radiating part 64 as described in the sixth embodiment.

In the above-described first to sixth embodiments, reduction and prevention of a change in the temperature of the nozzle member 70 resulting from evaporation of the liquid LQ when the liquid LQ is removed from the image plane (bottom face of the nozzle member 70) of the projection optical system PL have been mainly described. However, even in a state where the liquid LQ is held at the bottom face of the nozzle member 70, a state where a portion of the bottom face of the nozzle member 70 does not contact the liquid LQ may arise due to fluctuation of the interface position of the immersion region LR after the bottom face of the nozzle member has contacted the liquid LQ in the immersion region LR. Even in this case, a temperature change resulting from evaporation of the liquid LQ which may occur in at least a portion of the nozzle member 70 can be reduced or prevented by temporarily releasing formation of the immersion space as mentioned above and by regulating the temperature of the nozzle member 70 like in the above-described first to sixth embodiments.

Furthermore, in the above-described first to sixth embodiments, a change in the temperature of the nozzle member 70 is suppressed by regulating the temperature of the nozzle member 70. However, similarly to the nozzle member 70, the temperature of at least the front optical element LS1 of the projection optical system PL is changed due to the heat of evaporation of the liquid LQ with deactivation of formation of the immersion space. In this case, since the front optical element LS1 may be changed in its optical properties or damaged due to the temperature change, the temperature of the front optical element LS1 may be regulated, for example, by supply of a temperature regulating fluid, irradiation of infrared rays, or temperature regulating elements (Peltier elements, etc.).

As described above, the liquid LQ in each of the above embodiments is constituted by pure water. The pure water has advantages in that it can be easily obtained in large quantity in semiconductor manufacturing factories, etc. and in that it has no adverse effects on a photoresist and optical elements (lenses), etc. on the substrate P. Furthermore, since the pure water has no adverse effects on the environment and contains very low impurities, one can also expect effects such that the surface of the substrate P and the surface of an optical element provided at a tip face of the projection optical system PL are cleaned. When the purity of the pure water to be supplied from a factory, etc. is low, an exposure apparatus may have an ultrapure water manufacturing machine.

Also, it is said that the refractive index n of the pure water (water) with respect to exposure light EL with a wavelength of about 193 nm is about 1.44. Therefore, when an ArF excimer laser beam (with a wavelength of 193 nm) is used as the light source of the exposure light EL, it is possible to shorten the wavelength to 1/n, that is, to about 134 nm on the substrate P, thereby obtaining high resolution. Moreover, the depth of focus is expanded by about n times, that is, about 1.44 times, compared with in air. Therefore, when it would be permissible to ensure the same level of depth of focus as the case where it is used in air, it is possible to further increase the numerical aperture of the projection optical system PL, and the resolution improves as well in terms of this point.

In the above embodiments, the optical element LS1 is attached to the tip of the projection optical system PL, and this lens can be used to adjust the optical properties, for example, aberrations (spherical aberration, coma aberration, etc.), of the projection optical system PL. An optical plate used for adjustment of the optical properties of the projection optical system PL may also be used as the optical element attached to the tip of the projection optical system PL. Otherwise, a plane parallel plate (cover glass or the like) through which the exposure light EL is able to pass may also be used as the optical element.

If the pressure between the substrate P and the optical element at the tip of the projection optical system PL generated by the flow of the liquid LQ is large, it is permissible to make the optical element not one that is replaceable but one that is firmly secured so that the optical element may not be moved by the pressure.

The structure of the immersion mechanism 1 including the nozzle member 70 is not limited to the above-described structure. For example, structures described in European Patent Publication No. 1420298, PCT International Publication No. WO 2004/055803, PCT International Publication No. WO. 2004/057590, and PCT International Publication No. WO. 2005/029559 can be used.

In the above embodiments, the liquid LQ is filled between the projection optical system PL and the surface of the substrate P. However, for example, the liquid LQ may be filled at least between the surface of the substrate and a cover glass composed of a plane parallel plate in a state where the cover glass is attached to the surface of the substrate P.

In the above embodiments, the liquid LQ is filled between the projection optical system PL and the surface of the substrate P. However, for example, the liquid LQ may be filled in a state where a cover glass composed of a plane-parallel plate is attached to the surface of the substrate P.

Furthermore, the projection optical systems of the above-described embodiments are configured such that the optical path space on the side of the image plane of the optical element (LS1) at the tip of each system is filled with the liquid. However, as disclosed in International Publication No. WO 2004/019128, a projection optical system in which an optical path space on the side of an object plane of the optical element at the tip of the system is also filled with liquid can be adopted. Also, when a nozzle member for filling the optical path space on the side of the object plane with liquid is provided, a change in the temperature of the nozzle member may be suppressed.

Although the liquid LQ of the above embodiments is water (pure water), it may be a liquid other than water. For example, if the light source of the exposure light EL is an F2 laser, this F2 laser beam will not pass through water. Thus, the liquid LQ may be, for example, a fluorinated fluid, such as perfluoropolyether (PFPE) or fluorinated oil through which an F2 laser beam is able to pass. In this case, lyophilic treatment is performed on a portion in contact with the liquid LQ, for example, by forming a thin film from a substance having a polar small molecular structure containing fluorine. In addition, it is also possible to use, as the liquid LQ, liquids (for example, cedar oil) which have transmittance with respect to the exposure light EL, whose refractive index are as high as possible, and which are stable with respect to a photoresist coated on the projection optical system PL and the surface of the substrate P.

Furthermore, as the liquid LQ, a liquid with a refractive index of about 1.6 to 1.8 may be used. Moreover, the optical element LS1 may be formed from quartz, or a material having a higher refractive index (for example, 1.6 or more) than quartz. As the liquid LQ, various liquids, for example, a supercritical liquid, can also be used. Furthermore, in the above embodiments, the immersion region LR may be formed by supplying a liquid LQ having substantially the same temperature as the temperature of the substrate P. As a result, thermal deformation, etc. of the substrate P caused by a temperature difference between the substrate and the liquid LQ can be prevented.

In the above embodiments, positional information on each of the mask stage MST, the substrate stage ST1, and the measurement stage ST2 is measured using an interferometer system (52, 54, 56). However, the present invention is not limited thereto. For example, an encoder system which detects scales (diffraction grating) provided in each stage may be used. In this case, preferably, a hybrid system equipped with both the interferometer system and the encoder system is used, and calibration of measurement results of the encoder system is performed using measurement results of the interferometer system. Furthermore, positional control of the stage may be performed using the interferometer system and the encoder system interchangeably, or using both.

As the substrate P of the above embodiments, not only a semiconductor wafer for manufacturing a semiconductor device, but also a glass substrate for a display device, a ceramic wafer for a thin-film magnetic head, an original plate (synthetic quartz or silicon wafer) of a mask or reticle, which is used for an exposure apparatus, etc., can be used.

As for the exposure apparatus EX, the present invention can be applied to a step-and-repeat type projection exposure apparatus (stepper) in which the pattern of the mask M is one-shot exposed in a state where the mask M and the substrate P are stationary, and the substrate P is sequentially moved stepwise, in addition to a scan-type exposure apparatus (scanning stepper) in which, while the mask M and the substrate P are moved synchronously, a pattern of the mask M is scan-exposed.

Furthermore, as for the exposure apparatus EX, the present invention can also be applied to an exposure apparatus using a method in which a reduced image of a first pattern is one-shot exposed onto the substrate P by using a projection optical system (for example, a refractive projection optical system having a reduction magnification of ⅛, and having no reflecting element), in a state where the first pattern and the substrate P are substantially stationary. In this case, the present invention can also be applied to a stitch-type one-shot exposure apparatus in which, after the reduced image of the first pattern is one-shot exposed, a reduced image of a second pattern is one-shot exposed onto the substrate P by partially overlapping the first pattern and the second pattern using the projection optical system, in a state where the second pattern and the substrate P are substantially stationary. As for the stitch-type exposure apparatus, the present invention can also be applied to a step-and-stitch type exposure apparatus in which at least two patterns are transferred onto the substrate P in a partially overlapping manner, and the substrate P is sequentially moved.

Furthermore, in the above embodiments, the exposure apparatus equipped with the projection optical system PL is described as an example. However, the present invention can also be applied to an exposure apparatus and an exposure method which do not use such a projection optical system PL. Even in the case where the projection optical system is not used, exposure light can be radiated onto a substrate via an optical member such as a mask or lens, and an immersion region can be formed in a predetermined space between the optical element and the substrate.

Furthermore, the present invention can also be applied to a twin-stage type exposure apparatus equipped with a plurality of substrate stages, as disclosed for example in Japanese Unexamined Patent Application, First Publication No. H10-163099, Japanese Unexamined Patent Application, First Publication No. H10-214783 (corresponding to U.S. Pat. No. 6,590,634), Published Japanese Translation No. 2000-505958 of the PCT International Publication (corresponding to U.S. Pat. No. 5,969,411), and U.S. Pat. No. 6,208,407.

Furthermore, the present invention can also be applied to an exposure apparatus which is not equipped with a measurement stage, as disclosed in PCT International Publication No. WO 99/49504. Furthermore, the present invention can also be applied to an exposure apparatus equipped with a plurality of substrate stages and measurement stages.

Furthermore, in the above embodiments, an exposure apparatus in which liquid is locally filled between the projection optical system PL and the substrate P is adopted. However, the present invention can also be applied to an immersion exposure apparatus in which exposure is performed in a state where the whole surface of a target exposure substrate is immersed in a liquid, as disclosed for example in Japanese Unexamined Patent Application, First Publication No. H06-124873, Japanese Unexamined Patent Application, First Publication No. H10-303114, and U.S. Pat. No. 5,825,043.

As for the type of the exposure apparatus EX, the present invention is not limited to an exposure apparatus, for manufacturing semiconductor devices, which exposes a semiconductor device pattern onto a substrate P. For example, the present invention can also be widely applied to exposure apparatuses for manufacturing liquid crystal display devices or for manufacturing displays, and exposure apparatuses for manufacturing thin-film magnetic heads, charge-coupled devices (CCD), micro machines, MEMS, DNA chips, reticles, masks, etc.

In the above-described embodiments, an optical transmission type mask in which a predetermined shielding pattern (or phase pattern or dimming pattern) is formed on a light-transmitting substrate is used. However, instead of this mask, for example, as disclosed in U.S. Pat. No. 6,778,257, an electronic mask (also called a variable form mask, and including, for example, a DMD (Digital Micro-mirror Device) as one type of non-light-emitting type image display device (spatial light modulator) for forming a transmitting pattern, reflecting pattern, or a light-emitting pattern, on the basis of electronic data of a pattern to be exposed) may be used.

Furthermore the present invention can also be applied to an exposure apparatus (lithography system) which forms interference fringes on a substrate P to expose a run-and-space pattern onto the substrate P, as disclosed for example in PCT International Publication No. WO 2001/035168.

Moreover, the present invention can also be applied to an exposure apparatus as disclosed, for example, in Published Japanese Patent Translation No. 2004-519850 (corresponding to U.S. Pat. No. 6,611,316), which synthesizes patterns of two masks on a substrate via a projection optical system, and double-exposes a one-shot region on the substrate at substantially the same time, by a single scan exposure.

As far as the laws of the countries designated or elected in this patent application permit, the disclosures of all of the Japanese Patent Publications and U.S. patents related to the exposure apparatuses and the like cited in the above respective embodiments and modified examples, are incorporated herein by reference.

As described above, the exposure apparatuses EX of the embodiments of this application are manufactured by assembling various subsystems, including individual components as set forth in the claims of the present application so that predetermined mechanical precision, electrical precision, and optical precision can be maintained. In order to ensure these various precisions, adjustment for achieving optical precision with respect to various optical systems, adjustment for achieving mechanical precision with respect to various mechanical systems, and adjustment for achieving electrical precision with respect to various electrical systems are performed before and after the above assembly. The process of assembly from the various subsystems to the exposure apparatus includes mechanical connection, electrical circuit wiring connection, pneumatic circuit piping connection, etc. among the various subsystems. It is obvious that there are processes of assembly of each of the subsystems before the process of assembly from these various subsystems to the exposure apparatus. If the process of assembly of the various subsystems to the exposure apparatus has finished, overall adjustment is performed, and consequently the various precisions of the whole exposure apparatus are ensured. It is desirable that manufacture of the exposure apparatus be performed in a clean room in which temperature, cleanliness, etc. are managed.

Figure 11:
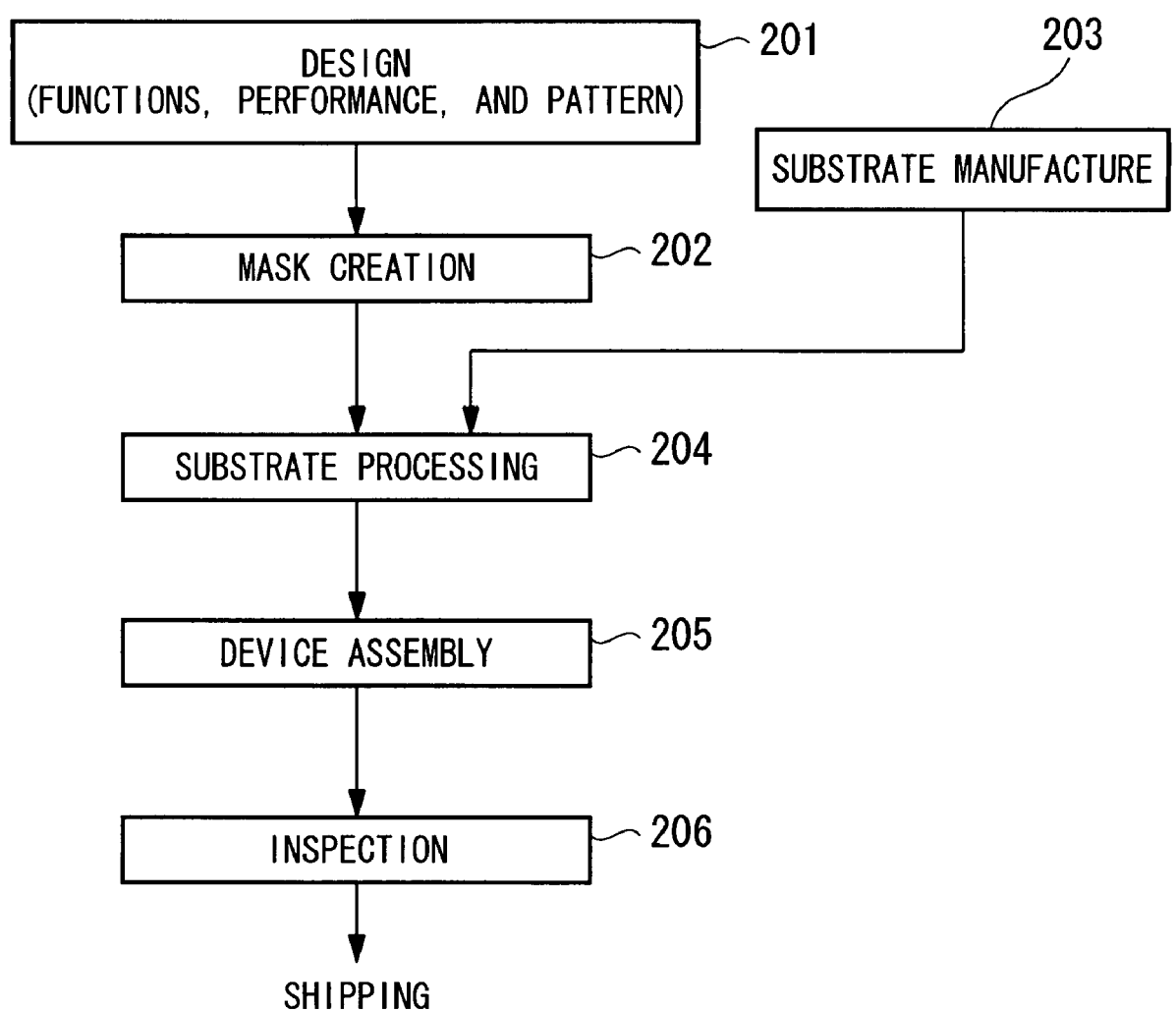
FIG. 11 is a flow chart showing an example of manufacturing steps for a micro device.

As shown in FIG. 11, micro devices such as semiconductor devices are manufactured through a step 201 of designing the function and performance of a micro device, a step 202 of fabricating a mask (reticle) on the basis of the designing step, a step 203 of manufacturing a substrate that is a device base material, a step 204 including substrate processing processes, such as a process of exposing a pattern on the mask onto a substrate by means of the exposure apparatus EX of the aforementioned embodiments, a process of developing the exposed substrate, and a process of heating (curing) and etching the developed substrate, a device assembly step 205 (including processing processes, such as a dicing process, a bonding process, and a packaging processing), and an inspection step 206.

INDUSTRIAL APPLICABILITY

According to the present invention, a substrate can be effectively exposed by preventing deterioration of exposure precision resulting from a change in the temperature of an immersion space forming member. In addition, the present invention is very useful for an exposure apparatus and method for manufacturing a wide range of products, such as semiconductor devices, liquid crystal display devices or displays, thin-film magnetic heads, CCDs, micro machines, MEMS, DNA chips, and reticles (masks).

The invention claimed is:

1. An exposure apparatus that exposes a substrate via a first liquid filled into an optical path space of exposure light, the apparatus comprising:
    an immersion space forming member that forms an immersion space to fill the optical path space with the first liquid, the immersion space forming member having a recovery port which recovers the first liquid forming the immersion space and a recovery passage connected to the recovery port, and the first liquid recovered from the recovery port being moved into the recovery passage; and
    a temperature regulating system that suppresses a change in the temperature of the immersion space forming member, the temperature regulating system having a supply passage connected to the recovery passage, a temperature regulating fluid from the supply passage being supplied to the recovery passage not through the recovery port.

2. The exposure apparatus according to claim 1, wherein the temperature regulating fluid is supplied to the recovery passage when the first liquid is removed from the optical path space.

3. The exposure apparatus according to claim 1, wherein the immersion space forming member has a supply port that supplies the first liquid.

4. The exposure apparatus according to claim 1, wherein the first liquid is held in at least a portion between the immersion space forming member and the substrate when the substrate is irradiated with the exposure light.

5. The exposure apparatus according to claim 1, wherein the exposure light is radiated onto the substrate via an optical element on the light emission side of which the immersion space is to be formed.

6. The exposure apparatus according to claim 5, wherein the temperature of the optical element is regulated at least while formation of the immersion space is deactivated.

7. The exposure apparatus according to claim 1, wherein the temperature regulating system suppresses a drop in the temperature of the immersion space forming member caused by heat of evaporation of the first liquid.

8. The exposure apparatus according to claim 1, wherein the temperature regulating system supplies the temperature regulating fluid in a state in which the optical path space is not filled with the first liquid.

9. The exposure apparatus according to claim 1, wherein the temperature regulating fluid is the same substance as the first liquid supplied to the optical path space.

10. The exposure apparatus according to claim 1,
wherein the temperature regulating system has a temperature regulator that regulates the temperature of the temperature regulating fluid.

11. The exposure apparatus according to claim 1,
wherein the temperature of the temperature regulating fluid is substantially equal to the temperature of the first liquid supplied to the optical path space.

12. The exposure apparatus according to claim 1,
wherein the temperature of the temperature regulating fluid is higher than the temperature of the first liquid supplied to the optical path space.

13. The exposure apparatus according to claim 1,
wherein the temperature regulating fluid includes a second liquid.

14. The exposure apparatus according to claim 13,
wherein the second liquid is supplied to the recovery passage in a state in which the first liquid exists in the optical path space.

15. The exposure apparatus according to claim 13, further comprising a liquid recovery device that recovers the first and second liquids of the recovery passage.

16. The exposure apparatus according to claim 13,
wherein a porous member is arranged in the recovery port.

17. The exposure apparatus according to claim 16,
wherein the aperture diameter on one side of each hole of the porous member is different from the aperture diameter on the other side of each hole.

18. The exposure apparatus according to claim 16,
wherein the pressure of the recovery passage is regulated so that the first liquid is recovered through the porous member without substantial passing of gas.

19. The exposure apparatus according to claim 13,
wherein the first liquid is removed from the optical path space by supply stoppage of the first liquid and recovery of the first liquid from the recovery port, and the second liquid is supplied to the recovery passage after the first liquid is removed from the optical path space.

20. The exposure apparatus according to claim 19,
wherein an amount per unit time of the second liquid supplied to the recovery passage after the first liquid is removed from the optical path space is larger than an amount per unit time of the second liquid supplied to the recovery passage during exposure of the substrate.

21. The exposure apparatus according to claim 19,
wherein an amount per unit time of the second liquid supplied to the recovery passage after the first liquid is removed from the optical path space is substantially equal to a sum of an amount per unit time of the second liquid supplied to the recovery passage during exposure of the substrate and an amount per unit time of the first liquid supplied to the optical path space during exposure of the substrate.

22. The exposure apparatus according to claim 13, wherein the first liquid and the second liquid include purified water.

23. A device manufacturing method using the exposure apparatus according to claim 1.

24. An exposure method of exposing a substrate with exposure light via a liquid, the method comprising:
exposing the substrate using an immersion space forming member that forms an immersion space to fill an optical path space for the exposure light with the liquid to form an immersion space; and
suppressing a change in the temperature of the immersion space forming member by supplying a temperature regulating fluid to the recovery passage not through the recovery port.

25. The exposure method according to claim 24,
wherein the temperature regulating fluid is supplied to the recovery passage when the liquid is removed from the optical path space.

26. The exposure method according to claim 24,
wherein the exposure light is radiated onto the substrate via an optical element and the liquid.

27. The exposure method according to claim 26,
further comprising regulating a temperature of the optical element at least while the optical path space is not filled with the liquid.

28. The exposure method according to claim 24,
wherein a drop in the temperature of the immersion space forming member caused by heat of evaporation of the liquid is suppressed.

29. The exposure method according to claim 24,
wherein the temperature regulating fluid is the same substance as the liquid supplied to the optical path space.

30. The exposure method according to claim 24,
wherein the temperature of the temperature regulating fluid is substantially equal to or higher than the temperature of the liquid in the immersion space.

31. A device manufacturing method using the exposure method according to claim 24.

* * * * *